(12) United States Patent
Matsubara et al.

(10) Patent No.: US 8,384,477 B2
(45) Date of Patent: Feb. 26, 2013

(54) DISTORTION COMPENSATING APPARATUS, AMPLIFYING APPARATUS, TRANSMITTING APPARATUS, AND DISTORTION COMPENSATING METHOD

(75) Inventors: Satoshi Matsubara, Kawasaki (JP); Shuya Hirata, Kawasaki (JP); Takeshi Ohba, Kawasaki (JP); Hideharu Shako, Kawasaki (JP); Jun Sugiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 66 days.

(21) Appl. No.: 12/985,552

(22) Filed: Jan. 6, 2011

(65) Prior Publication Data

US 2011/0227643 A1    Sep. 22, 2011

(30) Foreign Application Priority Data

Mar. 17, 2010   (JP) ................................ 2010-061657

(51) Int. Cl.
*H03F 1/26* (2006.01)
(52) U.S. Cl. ...................................................... 330/149
(58) Field of Classification Search .................. 330/149; 375/296–298; 455/114.3
See application file for complete search history.

(56) References Cited

U.S. PATENT DOCUMENTS

| 6,141,390 | A | * | 10/2000 | Cova | ............................. | 375/297 |
| 7,447,274 | B2 | | 11/2008 | Shako et al. | | |
| 2004/0208259 | A1 | | 10/2004 | Hunton | | |
| 2006/0209983 | A1 | | 9/2006 | Shako et al. | | |
| 2008/0186095 | A1 | | 8/2008 | Okazaki | | |

FOREIGN PATENT DOCUMENTS

| JP | 2003-347944 | 12/2003 |
| JP | 2006-261969 | 9/2006 |
| WO | 00/08870 | 2/2000 |
| WO | 01/05026 | 1/2001 |

OTHER PUBLICATIONS

European Search Report dated Jul. 29, 2011, from corresponding European Application No. 11 15 2185.
Korean Notice of Preliminary Rejection dated Jan. 13, 2012, from corresponding Korean Application No. 10-2011-3864.

* cited by examiner

*Primary Examiner* — Robert Pascal
*Assistant Examiner* — Khiem Nguyen
(74) *Attorney, Agent, or Firm* — Katten Muchin Rosenman LLP

(57) ABSTRACT

A distortion compensating apparatus that compensates signal distortion caused by an amplifier includes a distortion compensating process unit that using a distortion compensation coefficient, compensates distortion of an input signal; a memory unit storing therein the distortion compensation coefficient; and an address generating unit that generates a first address that is based on electrical power of the input signal and is for acquiring the distortion compensation coefficient from the memory unit, and a second address that is based on any one among the electrical power, phase of the input signal and amplitude of the input signal, is for acquiring the distortion compensation coefficient from the memory unit, and is normalized in a normalizing range determined according to the electrical power of the input signal. The distortion compensating process unit acquires the distortion compensation coefficient from the memory unit, based on the first and the second addresses to compensate the distortion.

10 Claims, 14 Drawing Sheets

| X-AXIS DIRECTION ADDRESS | NORMALIZATION MULTIPLYING FACTOR |
|---|---|
| 0 ~ 699 | 1.0 |
| 700 ~ 875 | 2.0 |

| X-AXIS DIRECTION ADDRESS | NORMALIZATION MULTIPLYING FACTOR |
|---|---|
| 0 ~ 574 | 1.0 |
| 575 ~ 624 | 2.0 |
| 625 ~ 875 | 4.0 |

DISTORTION COMPENSATING APPARATUS, AMPLIFYING APPARATUS, TRANSMITTING APPARATUS, AND DISTORTION COMPENSATING METHOD

CROSS REFERENCE TO RELATED APPLICATIONS

This application is based upon and claims the benefit of priority of the prior Japanese Patent Application No. 2010-061657, filed on Mar. 17, 2010, the entire contents of which are incorporated herein by reference.

FIELD

The embodiments discussed herein are related to signal distortion compensation.

BACKGROUND

In recent years, highly efficient transmission through digitization is achieved in radio communication, such as wideband code division multiple access (W-CDMA). When a scheme of multi-level phase modulation is applied in radio communication, a technique is adopted by which the amplification characteristics of a transmission-use electronic amplifier at the transmission-side are linearized to suppress nonlinear distortion and reduce electrical power leakage to adjacent channels. If electrical power efficiency is improved using an amplifier inferior in linearity, a technique for compensating nonlinear signal distortion is adopted (see, e.g., Japanese Laid-Open Patent Publication No. 2003-347944).

For example, in order to perform distortion compensation according to the state of the transmission signal to correct memory effect, one technique involves selecting a distortion compensating coefficient using a lookup table (LUT) that associates the coefficients with states of a transmission signal at different times (e.g., differences in electrical power, amplitude, etc.).

The conventional techniques, however, pose a problem of difficulty in accurately compensating signal distortions. For example, in mobile communication, such as W-CDMA, a transmitting apparatus uses great electrical power for transmission, which causes significant nonlinear distortion of the transmission signal, raising a side lobe of the frequency spectrum of the transmission signal and thereby, leading to a leak of electrical power of the transmission signal to adjacent channels. Such electrical power leakage creates noise, which deteriorates the communication quality of adjacent channels. If a wideband signal is used as a transmission signal, in particular, a memory effect becomes larger than in the case of using a narrowband signal. A larger memory effect results in difficulty in compensating distortion near the transmission signal caused by the memory effect.

Variations in the state of the transmission signal results in, for example, variations in the extent to which electrical power and amplitude in the transmission signal vary. Consequently, the distribution range of an address on in the LUT becomes narrower according to the state of the transmission signal, in which case the state of an input signal cannot be accurately identified even if the LUT is used, whereby selection of a proper distortion compensation coefficient is impossible and consequently accurate compensation of signal distortion is impossible.

SUMMARY

According to an aspect of an embodiment, a distortion compensating apparatus that compensates signal distortion caused by an amplifier includes a distortion compensating process unit that using a distortion compensation coefficient, compensates distortion of an input signal; a memory unit storing therein the distortion compensation coefficient; and an address generating unit that generates a first address that is based on electrical power of the input signal and is for acquiring the distortion compensation coefficient from the memory unit, and a second address that is based on any one among the electrical power, phase of the input signal and amplitude of the input signal, is for acquiring the distortion compensation coefficient from the memory unit, and is normalized in a normalizing range that is determined according to the electrical power of the input signal. The distortion compensating process unit acquires the distortion compensation coefficient from the memory unit, based on the first and the second addresses to compensate the distortion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to the accompanying drawings.

According to the technique disclosed herein, a normalizing range for an address is determined according to the electrical power of an input signal and the address is distributed for a state of the input signal so that a proper distortion compensation coefficient is selected according to the state of the input signal to accurately compensate nonlinear signal distortion caused by an amplifier.

Figure 1:
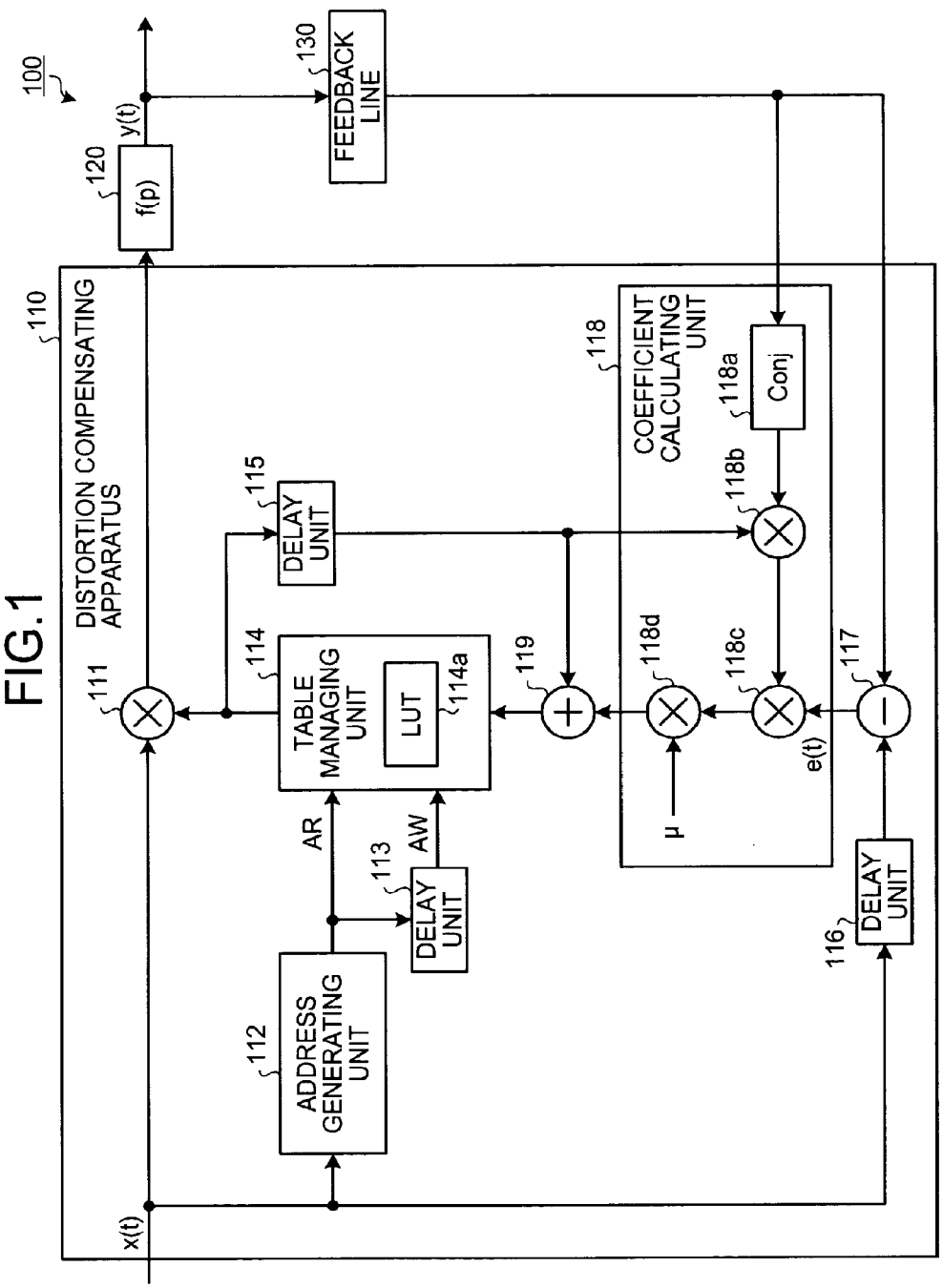
FIG. 1 is a block diagram of an example of a distortion compensating apparatus according to a first embodiment.

FIG. 1 is a block diagram of an example of a distortion compensating apparatus according to a first embodiment. As depicted in FIG. 1, an amplifying apparatus 100 includes a distortion compensating apparatus 110, an amplifier 120, and a feedback line 130. Using, for example, the adaptive least mean square (LMS) algorithm, the distortion compensating apparatus 110 compensates signal distortion caused by the amplifier 120.

As depicted in FIG. 1, the distortion compensating apparatus 110 includes a multiplying unit 111, an address generating unit 112, a delay unit 113, a table managing unit 114, a delay unit 115, a delay unit 116, a subtracting unit 117, a coefficient calculating unit 118, and an adding unit 119. In the following description, x, y, f, h, u, and e each denote a complex number, * denotes a conjugate complex number, and t denotes time.

A signal x(t) input to the distortion compensating apparatus 110 is input to the multiplying unit 111, to the address generating unit 112, and to the delay unit 116. The multiplying unit 111 is a distortion compensating process unit that uses a distortion compensation coefficient to compensate distortion of the signal. Specifically, the multiplying unit 111 multiplies the input signal x(t) by a distortion compensation coefficient hn-1(p) output from the table managing unit 114 and outputs the resulting signal to the amplifier 120.

The amplifier 120 has a nonlinear distortion function f(p) as an amplification property, and amplifies the signal output from the multiplying unit 111. The amplifier 120 outputs the amplified signal y(t) (=hn-1(p)×(t)f(p)). The signal y(t) from the amplifier 120 is output downstream and part of the signal y(t) is branched as a feedback signal y(t) to the feedback line 130.

The feedback line 130 is a circuit that feeds back the feedback signal y(t) that is a branch of the signal y(t) from the amplifier 120. For example, the feedback line 130 converts the feedback signal y(t) that is a branch of the signal y(t) from the amplifier 120, into a digital signal by frequency conversion and quadrature wave detection, and outputs the digitized feedback signal y(t) to the subtracting unit 117 and to the coefficient calculating unit 118.

The address generating unit 112 generates, based on the power (electrical power) of the input signal, a first address for acquiring a distortion compensation coefficient from the table managing unit 114. The address generating unit 112 also generates, based on the power of the input signal, a second address for acquiring a distortion compensation coefficient from the table managing unit 114. Further, the address generating unit 112 determines the normalizing range for the second address according to the power of the input signal (for example, see FIG. 2).

Specifically, the address generating unit 112 calculates the power p(=x2(t)) of the input signal x(t), and generates an address uniquely corresponding to the calculated power p as an X-axis direction address (first address). The address generating unit 112 calculates a power difference Δp between different points of time of the signal x(t), and generates an address uniquely corresponding to the calculated power difference Δp as a Y-axis direction address (second address).

The address generating unit 112 generates a synthesized address by synthesizing an X-axis direction address and a Y-axis direction address. The synthesized address is, for example, an address that uniquely corresponds to a combination of the X-axis direction address and the Y-axis direction address. For example, the address generating unit 112 generates the synthesized address made up of the X-axis direction address and the Y-axis direction address arranged as "X-axis direction address: Y-axis direction address". The synthesized address generated by the address generating unit 112 is output to the delay unit 113 and is further output as a read-in address AR to the table managing unit 114.

The delay unit 113 delays the synthesized address output from the address generating unit 112 and outputs the delayed synthesized address as a write-in address AW to the table managing unit 114. The delay rate at the delay unit 113 is set based on the calculation period needed to acquire an updated value for a lookup table (LUT) 114a by the subtracting unit 117 and the coefficient calculating unit 118. Hence, the synthesized address output from the address generating unit 112 can be used as the write-in address AW.

The table managing unit 114 is a memory unit that stores therein distortion compensation coefficients calculated by the subtracting unit 117 and the coefficient calculating unit 118. Specifically, the table managing unit 114 stores the LUT 114a that associates distortion compensation coefficients with two-dimensional addresses. A distortion compensation coefficient is a coefficient that is used in distortion compensation by the multiplying unit 111. A two-dimensional address is an address that is a combination of an X-axis direction address and a Y-axis direction address.

The table managing unit 114 acquires the X-axis direction address and the Y-axis direction address from the read-in address AR output from the address generating unit 112, and reads out a distortion compensation coefficient associated with the acquired X-axis direction address and the Y-axis direction address from the LUT 114a. The table managing unit 114 outputs the read distortion compensation coefficient hn-1(p) to the multiplying unit 111 and to the delay unit 115.

The table managing unit 114 acquires the X-axis direction address and the Y-axis direction address from the write-in address AW output from the delay unit 113. The table managing unit 114 then writes an updated distortion compensation coefficient value output from the adding unit 119, to an area of the LUT 114a that corresponds to the acquired X-axis direction address and the Y-axis direction address.

The delay unit 115 delays the distortion compensation coefficient hn-1(p) output from the table managing unit 114 and outputs the delayed distortion compensation coefficient hn-1(p) to the coefficient calculating unit 118 and to the adding unit 119. The delay unit 116 delays the input signal x(t) and outputs the delayed input signal x(t) to the subtracting unit 117.

The subtracting unit 117 and the coefficient calculating unit 118 is a calculating unit that based on the input signal not yet subject to distortion compensation by the multiplying unit 111 and an output signal from the amplifier 120, calculates a distortion compensation coefficient. Specifically, the subtracting unit 117 outputs to the coefficient calculating unit 118, the difference e(t) of the feedback signal y(t) output from the feedback line 130 and the signal x(t) output from the delay unit 116. The coefficient calculating unit 118 calculates an updated value for a distortion compensation coefficient stored in the LUT 114a of the table managing unit 114. Specifically, the coefficient calculating unit 118 has a conjugate complex signal output unit (Conj) 118a and multiplying units 118b to 118d.

The conjugate complex signal output unit 118a outputs to the multiplying unit 118b, a conjugate complex signal y*(t) of the feedback signal y(t) from the feedback line 130. The multiplying unit 118b outputs to the multiplying unit 118c, the product u*(t) (=hn-1(p)y*(t)) of the distortion compensation coefficient hn-1(p) from the delay unit 115 and the conjugate complex signal y*(t) from the conjugate complex signal output unit 118a.

The multiplying unit 118c outputs to the multiplying unit 118d, the product e(t)u*(t) of the difference e(t) from the subtracting unit 117 and the multiplication result u*(t) from the multiplying unit 118b. The multiplying unit 118d outputs to the adding unit 119, the product μe(t)u*(t) of the multiplication result e(t)u*(t) from the multiplying unit 118c and a step size parameter μ.

The adding unit 119 adds the distortion compensation coefficient hn-1(p) from the delay unit 115 and the multiplication result μe(t)u*(t) from the multiplying unit 118d and outputs to the table managing unit 114, the sum hn-1(p)+μe(t)u*(t) as an updated value for the LUT 114a. The updated value output from the adding unit 119 is written to an area of the LUT 114a that corresponds to the write-in address AW input to the table managing unit 114.

The delay time at each of the delay units 113, 115, and 116 is determined to be, for example, a time D from the point that the signal x(t) enters the distortion compensating apparatus 110 to the point that the feedback signal y(t) enters the subtracting unit 117. Specifically, when a signal delay time at the amplifier 120 is D0 and a signal delay time at the feedback line 130 is D1, each delay time at the delay units 113, 115, and 116 is determined to be D0+D1.

As a result, for the write-in address AW input to the table managing unit 114, a distortion compensation coefficient in the LUT 114a of the table managing unit 114 is updated to a distortion compensation coefficient h(p) that minimizes the difference signal e(t) representing the difference e(t) between the signal x(t) and the feedback signal y(t). The distortion compensation coefficient thus converges to an optimum distortion compensation coefficient, by which signal distortion by the amplifier 120 is compensated.

In this manner, based on the X-axis direction address and the Y-axis direction address to carry out distortion compensation, a distortion compensation coefficient is acquired from the LUT 114a of the table managing unit 114, thereby enabling control of nonlinear distortion to reduce electrical power leakage to adjacent channels.

Although, the described configuration is such that the address generating unit 112 generates and outputs a synthesized address that is a synthesis of an X-axis direction address and a Y-axis direction address, a configuration other than such configuration is applicable provided the configuration enables the table managing unit 114 to acquire the X-axis direction address and the Y-axis direction address. For example, the configuration may be such that the address generating unit 112 outputs both the X-axis direction address and the Y-axis direction address.

Figure 2:
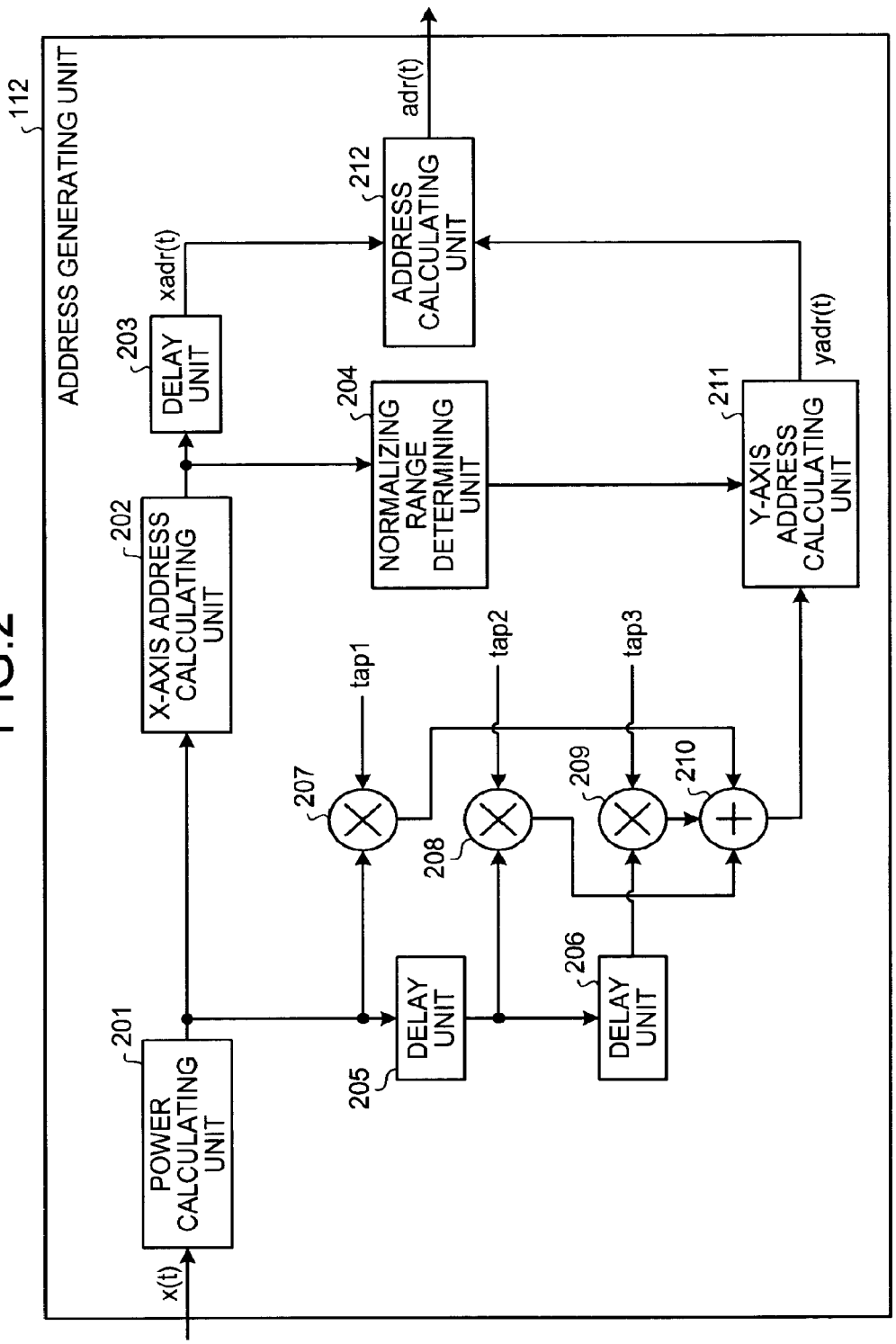
FIG. 2 is a block diagram of an example of an address generating unit depicted in FIG. 1.

FIG. 2 is a block diagram of an example of the address generating unit depicted in FIG. 1. As depicted in FIG. 2, the address generating unit 112 includes a power calculating unit 201, an X-axis address calculating unit 202, a delay unit 203, a normalizing range determining unit 204, delay units 205, 206, multiplying units 207 to 209, an adding unit 210, a Y-axis address calculating unit 211, and an address calculating unit 212. The signal x(t) input to the address generating unit 112 is input to the power calculating unit 201.

The power calculating unit 201, the X-axis address calculating unit 202, and the delay unit 203 generate, based on the electrical power (power) of the input signal x(t), the first address for acquiring a distortion compensation coefficient from the table managing unit 114. Specifically, the power calculating unit 201 calculates the power p (=x2(t)) of the input signal x(t). The power calculating unit 201 outputs power information indicative of the calculated power p to the X-axis address calculating unit 202, to the delay unit 205, and to the multiplying unit 207.

The X-axis address calculating unit 202 normalizes the power information output from the power calculating unit 201 to calculate an X-axis direction address, and outputs the calculated X-axis direction address to the delay unit 203 and to the normalizing range determining unit 204. The delay unit 203 delays the X-axis direction address output from the X-axis address calculating unit 202 by one sample and outputs the delayed X-axis direction address to the address calculating unit 212 (xadr(t)).

The normalizing range determining unit 204 determines a normalizing range in the normalization of a Y-axis direction address by the Y-axis address calculating unit 211. Specifically, the normalizing range determining unit 204 determines a normalization multiplying factor based on the X-axis direction address output from the X-axis address calculating unit 202. The normalizing range determining unit 204 provides the determined normalization multiplying factor to the Y-axis address calculating unit 211.

For example, a memory (correlation information memory unit) of the distortion compensating apparatus 110 has correlation information correlating the X-axis direction address with normalization multiplying factors (normalizing ranges) stored in the memory in advance. The normalizing range determining unit 204 acquires a normalization multiplying factor correlated with the X-axis direction address from the correlation information, and provides the acquired normalization multiplying factor to the Y-axis address calculating unit 211.

The power calculating unit 201, the delay units 205 and 206, the multiplying units 207 to 209, the adding unit 210, and the Y-axis address calculating unit 211 generate a second address for acquiring the distortion compensation coefficient from the table managing unit 114 based on the power (electrical power) of the input signal. Specifically, the delay unit 205 delays the power information output from the power calculating unit 201 by one sample and outputs the delayed power information to the delay unit 206 and to the multiplying unit 208. The delay unit 206 delays the power information output from the delay unit 205 by one sample and outputs the delayed power information to the multiplying unit 209.

The multiplying unit 207 multiplies the power information output from the power calculating unit 201 by a tap coefficient tap1 and outputs the resulting power information to the adding unit 210. The multiplying unit 208 multiplies the power information output from the delay unit 205 by a tap coefficient tap2 and outputs the resulting power information to the adding unit 210. The multiplying unit 209 multiplies the power information output from the delay unit 206 by a tap coefficient tap3 and outputs the resulting power information to the adding unit 210. The adding unit 210 adds up the signals output from the multiplying units 207 to 209.

The sum obtained by the adding unit 210 represents power differences (electrical power differences) Δp between three different points of time (e.g., past, present, and future) of the signal x(t). While a case of calculating the power differences Δp between three points of time is described, power differences Δp between other points of time, such as two or four or more points of time, may be calculated. The adding unit 210 outputs the sum as power difference information to the Y-axis address calculating unit 211.

The Y-axis address calculating unit 211 normalizes the power difference information output from the adding unit 210 to calculate a Y-axis direction address, where the Y-axis address calculating unit 211 carries out the normalization using the normalization multiplying factor provided by the normalizing range determining unit 204. The Y-axis address calculating unit 211 outputs the calculated Y-axis direction address to the address calculating unit 212. For example, the Y-axis address calculating unit 211 calculates the Y-axis direction address using the following equation (1).

$$yadr = \Delta p \times yadrMAX/\Delta pMAX \times \text{normalization multiplying factor} \quad (1)$$

In equation (1), yadr denotes the Y-axis direction address, $\Delta p$ denotes a power difference $\Delta p$ indicated by power difference information, yadrMAX denotes the maximum of the Y-axis direction address, $\Delta p$MAX denotes the maximum of the power difference $\Delta p$, and normalization multiplying factor represents a normalization multiplying factor provided by the normalizing range determining unit 204. In this manner, the Y-axis direction address (second address) is generated based on the power difference $\Delta p$ of the power p calculated by the power calculating unit 201 and power consequent to delaying the calculated power p by a given time.

The address calculating unit 212 synthesizes the X-axis direction address (xadr(t)) output from the delay unit 203 and the Y-axis direction address (yadr(t)) output from the Y-axis address calculating unit 211 to output a synthesized address (adr(t)). The synthesized address (adr(t)) output by the address calculating unit 212 is output to the delay unit 113 and is further output as the read-in address AR to the table managing unit 114.

In this manner, the Y-axis direction address (second address) is generated based on the power difference $\Delta p$ of the power p calculated by the power calculating unit 201 and the power p consequent to delaying the calculated power p by the given time. Hence, the distortion compensating apparatus 110 is able to compensate distortion, based on an LUT 114a, using a two-dimensional address corresponding to the power p and the power difference $\Delta p$ of the signal x(t), thereby lowering a side lobe of the frequency spectrum of an output waveform from the amplifier 120 and reducing electrical power leakage to adjacent channels.

Although the described configuration is such that the normalizing range determining unit 204 determines a normalization multiplying factor based on the X-axis direction address, a configuration other than such a configuration is possible. For example, the normalizing range determining unit 204 may acquire the power information output from the power calculating unit 201 to determine a normalization multiplying factor based on the acquired power information.

In this case, for example, correlation information correlating power information with normalization multiplying factors is preliminarily stored to the memory of the distortion compensating apparatus 110. The normalizing range determining unit 204 acquires from the correlation information, a normalization multiplying factor correlated with the power information output from the power calculating unit 201, and provides the acquired normalization multiplying factor to the Y-axis address calculating unit 211.

The delay rate at each of the delay units 203, 205, and 206 is not limited to a delay time equivalent to one sample of the signal x(t). For example, the delay rate at each of the delay units 203, 205, and 206 may be determined to be a delay time equivalent to ½ or 2 times one sample of the signal x(t).

For example, the delay rate at each of the delay units 203 and 205 is set so that the power information output from the power calculating unit 201 and power information output from the multiplying unit 208 match in timing. As a result, the bower information output from the multiplying unit 208 is used as a reference for the Y-axis direction address to match output timing of the X-axis direction address to that of the Y-axis direction address.

Figure 3:
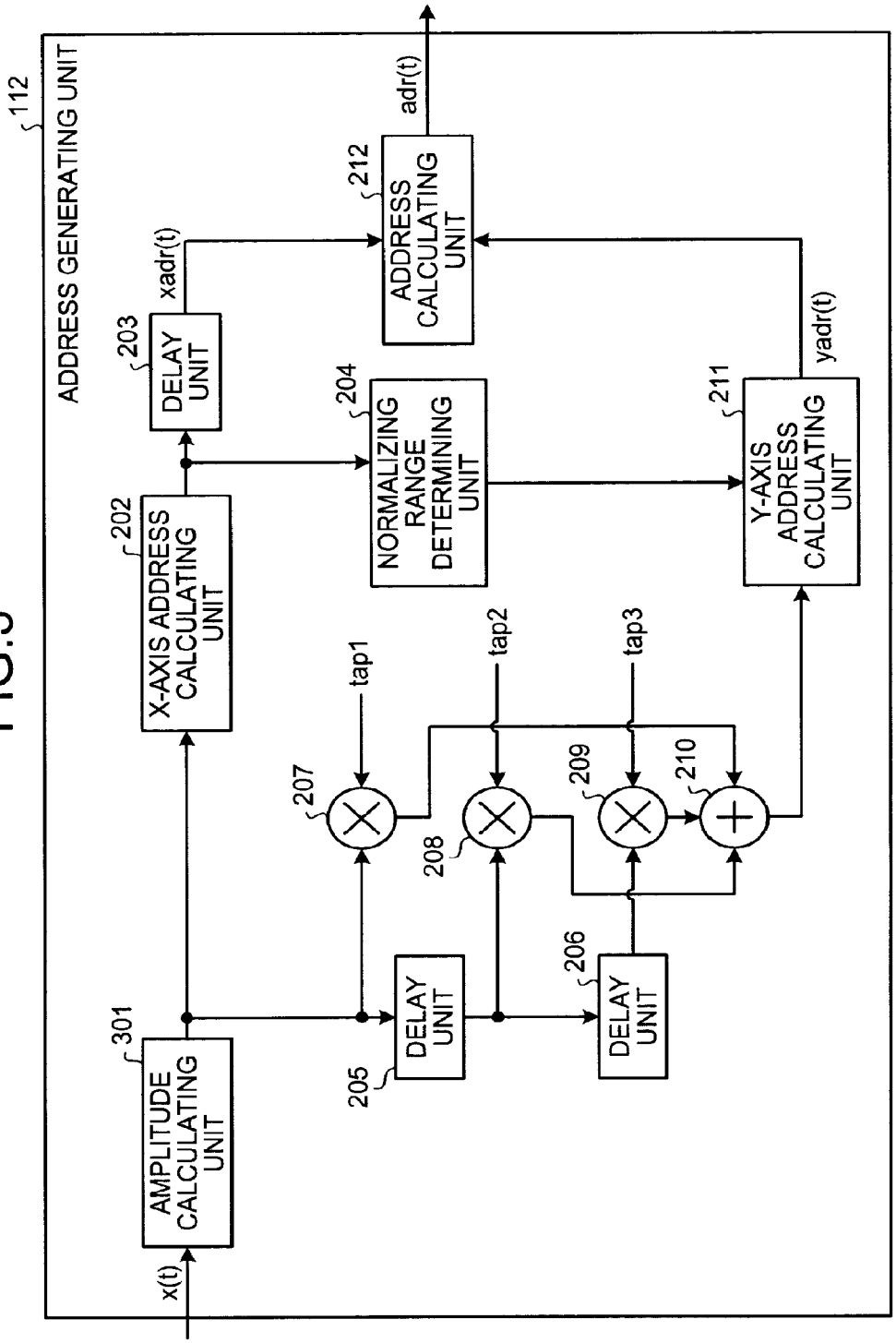
FIG. 3 is a block diagram of a first modification of the address generating unit depicted in FIG. 2.

FIG. 3 is a block diagram of a first modification of the address generating unit depicted in FIG. 2. In FIG. 3, constituent elements identical to those depicted in FIG. 2 are denoted by the same reference numerals used in FIG. 2 and will be omitted in further description. As depicted in FIG. 3, the address generating unit 112 may include an amplitude calculating unit 301 in place of the power calculating unit 201 depicted in FIG. 2. The signal x(t) input to the address generating unit 112 is input to the amplitude calculating unit 301.

The amplitude calculating unit 301, the X-axis address calculating unit 202, and the delay unit 203 generate the first address for acquiring a distortion compensation coefficient from the table managing unit 114. The amplitude calculating unit 301 calculates the amplitude $\sqrt{p}$ ($=\sqrt{(x^2(t))}$) of the signal x(t) from the power p ($=x^2(t)$) of the input signal x(t). The amplitude calculating unit 301 outputs amplitude information indicative of the calculated amplitude $\sqrt{p}$ to the X-axis address calculating unit 202, the delay unit 205, and the multiplying unit 207. The X-axis address calculating unit 202 normalizes amplitude information output from the amplitude calculating unit 301 to calculate the X-axis direction address.

The amplitude calculating unit 301, the delay units 205 and 206, the multiplying units 207 to 209, the adding unit 210, and the Y-axis address calculating unit 211 generate based on the amplitude of the input signal, the second address for acquiring a distortion compensation coefficient from the table managing unit 114. Specifically, the delay unit 205 delays the amplitude information output from the amplitude calculating unit 301 by one sample and outputs the delayed amplitude information to the delay unit 206 and to the multiplying unit 208. The delay unit 206 delays the amplitude information output from the delay unit 205 by one sample and outputs the delayed amplitude information to the multiplying unit 209.

The multiplying unit 207 multiplies the amplitude information output from the amplitude calculating unit 301 by the tap coefficient tap1 and outputs the resulting amplitude information to the adding unit 210. The multiplying unit 208 multiplies the amplitude information output from the delay unit 205 by the tap coefficient tap2 and outputs the resulting amplitude information to the adding unit 210. The multiplying unit 209 multiplies the amplitude information output from the delay unit 206 by the tap coefficient tap3 and outputs the resulting amplitude information to the adding unit 210.

In this case, the sum obtained by the adding unit 210 represents amplitude differences $\Delta\sqrt{p}$ between three different points of time (e.g., past, present, and future) of the signal x(t). While a case of calculating the amplitude differences $\Delta\sqrt{p}$ between three points of time is described, amplitude differences $\Delta\sqrt{p}$ between other points of time, such as two or four or more points of time, may also be calculated. The adding unit 210 outputs the sum as amplitude difference information to the Y-axis address calculating unit 211.

The Y-axis address calculating unit 211 normalizes the amplitude difference information output from the adding unit 210 to calculate the Y-axis direction address, where the Y-axis address calculating unit 211 uses a normalization multiplying factor provided by the normalizing range determining unit 204 to carry out the normalization.

In this manner, the Y-axis direction address (second address) is generated based on the amplitude difference $\Delta\sqrt{p}$ between the amplitude $\sqrt{p}$ calculated by the amplitude calculating unit 301 and an amplitude √p consequent to delaying the calculated amplitude √p by a given time. Hence, the distortion compensating apparatus 110 is able to compensate distortion, based on the LUT 114a, using a two-dimensional address corresponding to the power p and the amplitude difference Δ√p of the signal x(t), thereby lowering a side lobe of the frequency spectrum of an output waveform from the amplifier 120 to reduce electrical power leakage to adjacent channels.

Figure 4:
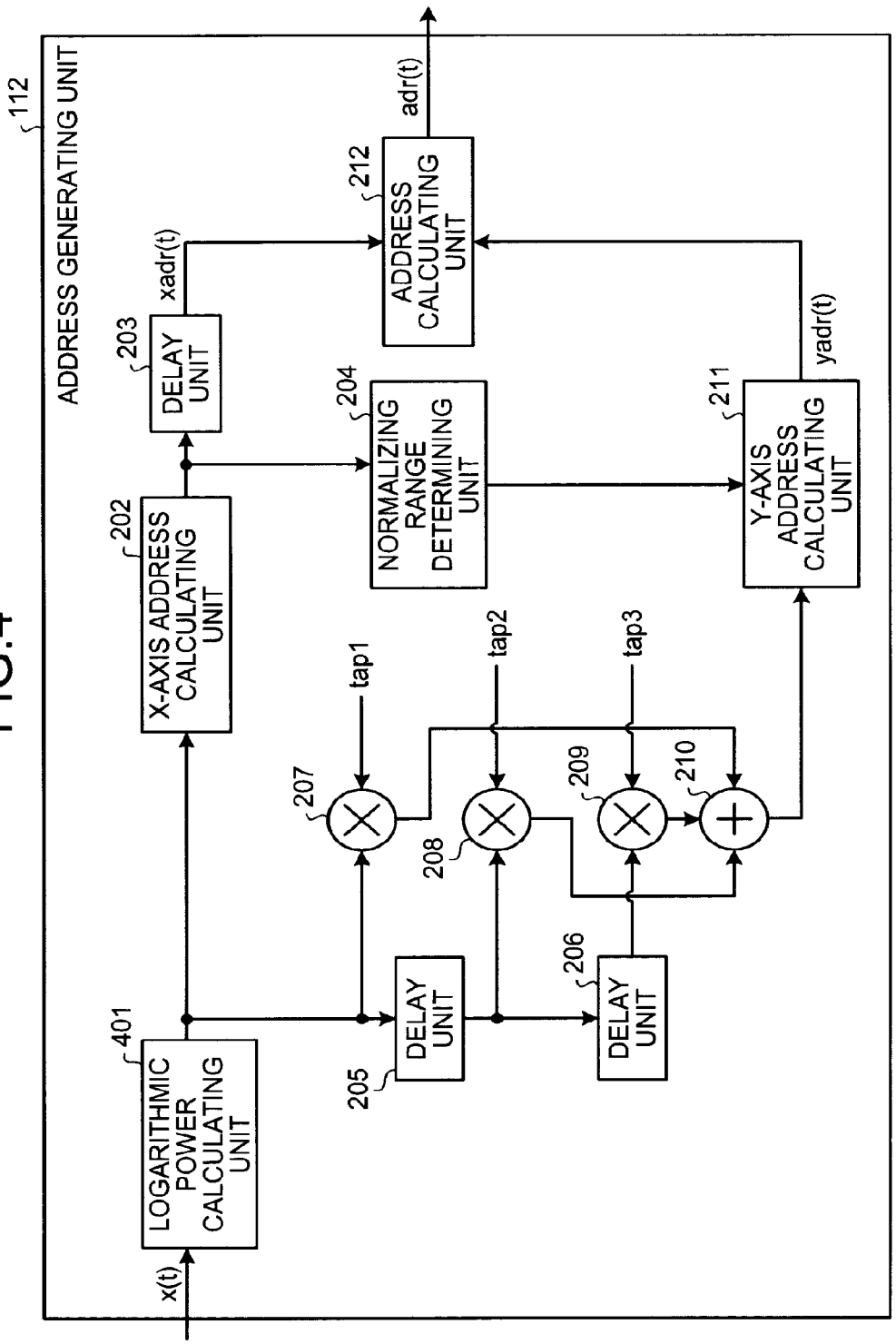
FIG. 4 is a block diagram of a second modification of the address generating unit depicted in FIG. 2.

FIG. 4 is a block diagram of a second modification of the address generating unit depicted in FIG. 2. In FIG. 4, constituent elements identical to those depicted in FIG. 2 are denoted by the same reference numerals used in FIG. 2 and will be omitted in further description. As depicted in FIG. 4, the address generating unit 112 may include a logarithmic electrical power calculating unit 401 in place of the power calculating unit 201 of FIG. 2. The signal x(t) input to the address generating unit 112 is input to the logarithmic electrical power calculating unit 401.

Based on a logarithmic value (logarithmic value $\log_e p$) of the electrical power of the input signal, the logarithmic electrical power calculating unit 401, the X-axis address calculating unit 202, and the delay unit 203 generate the first address for acquiring a distortion compensation coefficient from the table managing unit 114.

The logarithmic electrical power calculating unit 401 outputs logarithmic electrical power information indicative of the calculated logarithmic value logep to the X-axis address calculating unit 202, to the delay unit 205, and to the multiplying unit 207. The X-axis address calculating unit 202 normalizes the logarithmic electrical power information output from the logarithmic electrical power calculating unit 401 to calculate the X-axis direction address.

The logarithmic electrical power calculating unit 401, the delay units 205 and 206, the multiplying units 207 to 209, the adding unit 210, and the Y-axis address calculating unit 211 generate the second address for acquiring a distortion compensation coefficient from the table managing unit 114, based on the logarithmic value logep of the power p of the input signal. Specifically, the delay unit 205 delays the logarithmic electrical power information output from the logarithmic electrical power calculating unit 401 by one sample and outputs the delayed logarithmic electrical power information to the delay unit 206 and to the multiplying unit 208. The delay unit 206 delays the logarithmic electrical power information output from the delay unit 205 by one sample and outputs the delayed logarithmic electrical power information to the multiplying unit 209.

The multiplying unit 207 multiplies the logarithmic electrical power information output from the logarithmic electrical power calculating unit 401 by the tap coefficient tap1 and outputs the resulting logarithmic electrical power information to the adding unit 210. The multiplying unit 208 multiplies the logarithmic electrical power information output from the delay unit 205 by the tap coefficient tap2 and outputs the resulting logarithmic electrical power information to the adding unit 210. The multiplying unit 209 multiplies the logarithmic electrical power information output from the delay unit 206 by the tap coefficient tap3 and outputs the resulting logarithmic electrical power information to the adding unit 210.

In this case, the sum obtained by the adding unit 210 represents logarithmic electrical power differences Δlogep between three different points of time (e.g., past, present, and future) of the input signal. While a case of calculating the logarithmic electrical power differences Δlogep between three points of time is described, logarithmic electrical power differences Δlogep between other points of time, such as two or four or more points of time, may also be calculated. The adding unit 210 outputs the sum as logarithmic electrical power difference information to the Y-axis address calculating unit 211.

The Y-axis address calculating unit 211 normalizes the logarithmic electrical power difference information output from the adding unit 210 to calculate the Y-axis direction address, where the Y-axis address calculating unit 211 uses a normalization multiplying factor provided by the normalizing range determining unit 204 to carry out the normalization.

In this manner, the Y-axis direction address (second address) is generated based on the logarithmic electrical power difference Δlogep between the logarithmic value logep calculated by the logarithmic electrical power calculating unit 401 and a logarithmic value logep consequent to delaying the calculated logarithmic value logep by a given time. Hence, the distortion compensating apparatus 110 is able to compensate distortion, based on the LUT 114a, using a two-dimensional address corresponding to the power p and the logarithmic electrical power difference Δlogep of the signal x(t), thereby lowering a side lobe of the frequency spectrum of an output waveform from the amplifier 120 to reduce electrical power leakage to adjacent channels.

In this manner, the distortion compensating apparatus 110 according to the first embodiment determines a normalizing range for the Y-axis direction address according to the electrical power of an input signal, thereby enabling distribution of the Y-axis direction address for a state of the input signal (e.g., power difference Δp) and accurate identification of the state of the input signal by the Y-axis direction address. Consequently, a proper distortion compensation coefficient can be selected from the table managing unit 114 according to the state of input signal.

As a result, nonlinear signal distortion caused by a memory effect at the amplifier 120 is compensated accurately. Thus, if electrical power efficiency is improved using, for example, the amplifier 120 inferior in linearity, nonlinear signal distortion is compensated accurately to reduce electrical power leakage to adjacent channels.

Although the distortion compensating apparatus 110 according to a second embodiment has the same configuration as that depicted in FIG. 1, the address generating unit 112 of the distortion compensating apparatus 110 according to the second embodiment calculates an amplitude difference Δ√p between different points of time with respect to the signal x(t) and generates an address uniquely corresponding to the calculated amplitude difference Δ√p as the Y-axis direction address (second address).

Figure 5:
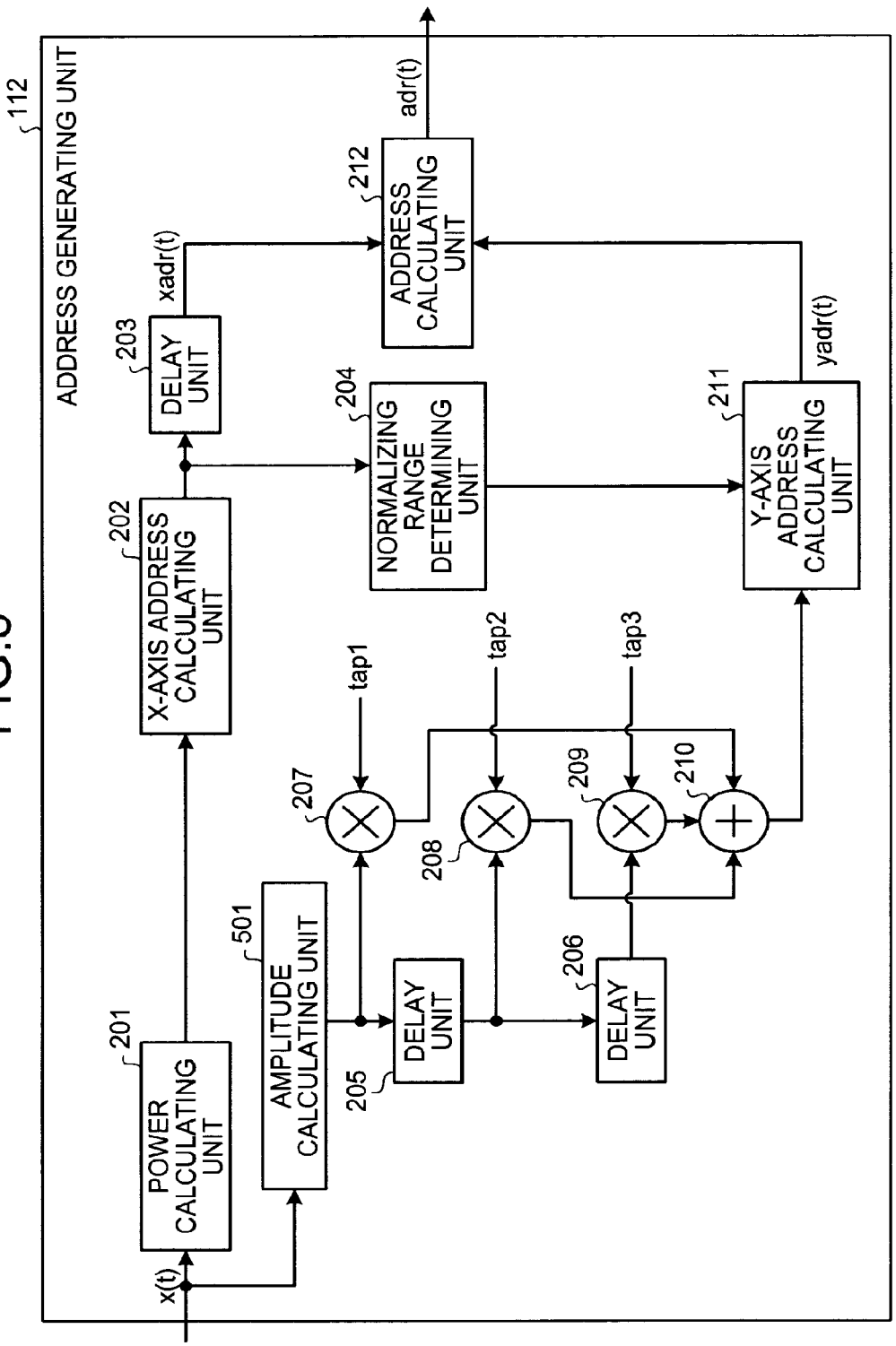
FIG. 5 is a block diagram of an example of the address generating unit according to a second embodiment.

FIG. 5 is a block diagram of an example of the address generating unit according to the second embodiment. In FIG. 5, constituent elements identical to those depicted in FIG. 2 are denoted by the same reference numerals used in FIG. 2 and will be omitted in further description. As depicted in FIG. 5, the address generating unit 112 of the second embodiment further includes an amplitude calculating unit 501, in addition to the constituent elements depicted in FIG. 2. The signal x(t) input to the address generating unit 112 is input to the power calculating unit 201 and to the amplitude calculating unit 501.

The amplitude calculating unit 501 calculates the amplitude √p (=√(x2(t))) of the signal x(t) from the power p (=x2(t)) of the input signal x(t), and outputs amplitude information indicative of the calculated amplitude √p to the delay unit 205 and to the multiplying unit 207. The delay unit 205 delays the amplitude information output from the amplitude calculating unit 501 by one sample and outputs the delayed amplitude information to the delay unit 206 and to the multiplying unit 208. The delay unit 206 delays the amplitude information output from the delay unit 205 by one sample and outputs the delayed amplitude information to the multiplying unit 209.

The multiplying unit 207 multiplies the amplitude information output from the amplitude calculating unit 501 by the tap coefficient tap1 and outputs the resulting amplitude information to the adding unit 210. The multiplying unit 208 multiplies the amplitude information output from the delay unit 205 by the tap coefficient tap2 and outputs the resulting amplitude information to the adding unit 210. The multiplying unit 209 multiplies the amplitude information output from the delay unit 206 by the tap coefficient tap3 and outputs the resulting amplitude information to the adding unit 210.

In this case, the sum obtained by the adding unit 210 represents amplitude differences $\Delta\sqrt{p}$ between three different points of time (e.g., past, present, and future) of the signal X(t). While a case of calculating the amplitude differences $\Delta\sqrt{p}$ between three points of time is described, amplitude differences $\Delta\sqrt{p}$ between other points of time, such as two or four or more points of time, may also be calculated. The adding unit 210 outputs the sum as amplitude difference information to the Y-axis address calculating unit 211, which normalizes the amplitude difference information output from the adding unit 210 to calculate the Y-axis direction address.

Hence, the distortion compensating apparatus 110 is able to compensate distortion, based on the LUT 114a, using a two-dimensional address corresponding to the power p and the amplitude difference $\Delta\sqrt{p}$ of the signal x(t), thereby enabling the lowering of a side lobe of the frequency spectrum of an output waveform from the amplifier 120 and a reduction in power leakage to adjacent channels.

Figures 6, 7:
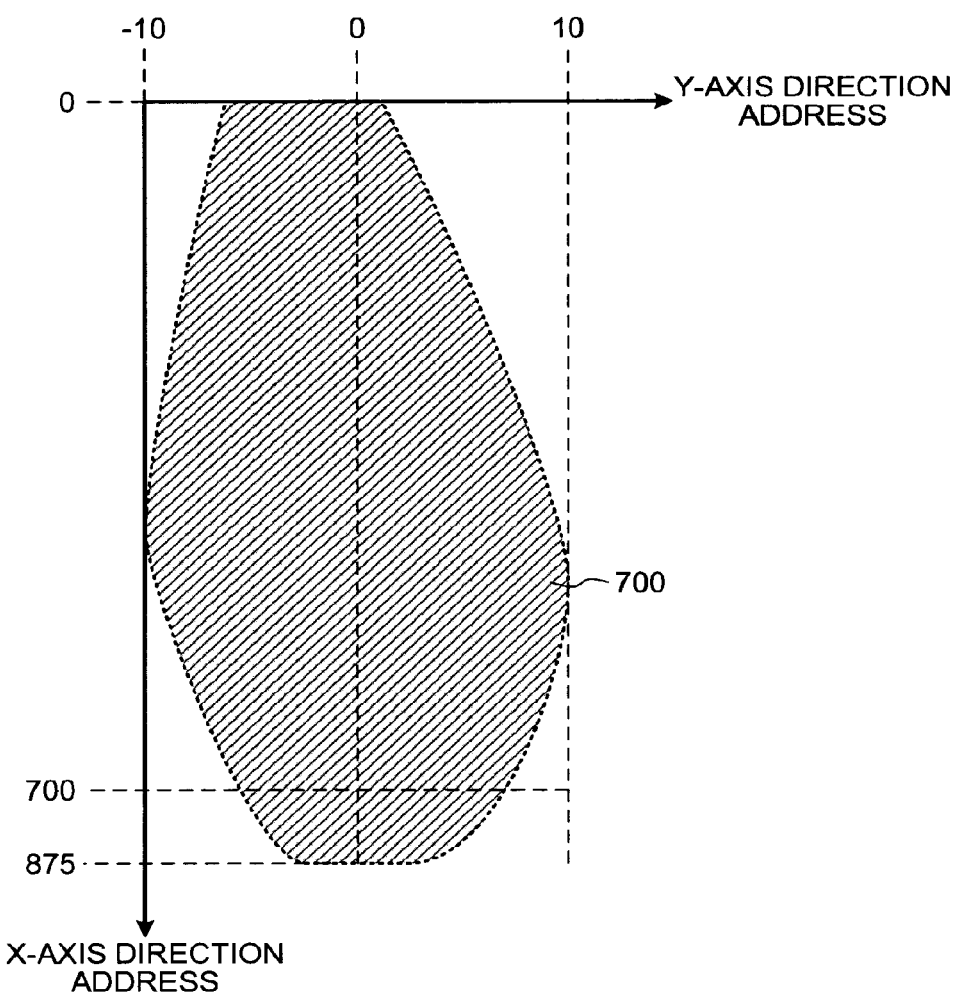
FIG. 6 depicts an example of correlation information indicative of the correlation between X-axis direction addresses and normalizing ranges.
FIG. 7 is a graph of a distribution of both addresses before expansion of the normalizing range.

FIG. 6 depicts an example of correlation information indicative of the correlation between X-axis direction addresses and normalizing ranges. In this example, the minimum of the X-axis direction address is determined to be 0 while the maximum of the same is determined to be 875, and the minimum of the Y-axis direction address is determined to be −10 while the maximum of the same is determined to be 10. The memory (correlation information memory unit) of the distortion compensating apparatus 110, for example, has a table 600 depicted in FIG. 6 stores therein. In the table 600, each range of the X-axis direction address is correlated respectively with a normalization multiplying factor.

Specifically, a range of 0 to 699 of the X-axis direction address is correlated with a normalization multiplying factor of 1.0. If the normalization multiplying factor is 1.0, the Y-axis direction address of 10 is equivalent to the amplitude difference $\Delta\sqrt{p}$ of 200. A range of 700 to 875 of the X-axis direction address is correlated with a normalization multiplying factor of 2.0. If the normalization multiplying factor is 2.0, the Y-axis direction address of 10 is equivalent to the amplitude difference $\Delta\sqrt{p}$ of 100.

The normalizing range determining unit 204 acquires from the table 600, the normalization multiplying factor correlated with the X-axis direction address output from the X-axis address calculating unit 202. The normalizing range determining unit 204 provides the acquired normalization multiplying factor to the Y-axis address calculating unit 211, which calculates the Y-axis direction address based on, for example, equation (2).

$$yadr = \Delta\sqrt{p} \times yadrMAX/200 \times \text{normalization multiplying factor} \quad (2)$$

In equation (2), yadr denotes the Y-axis direction address, $\Delta\sqrt{p}$ denotes an amplitude difference $\Delta\sqrt{p}$ indicated by amplitude difference information, yadrMAX denotes the maximum of the Y-axis direction address, $\Delta$pMAX denotes the maximum of the power difference $\Delta$p, 200 denotes the maximum that the amplitude difference $\Delta\sqrt{p}$ can take, and normalization multiplying factor represents a normalization multiplying factor provided by the normalizing range determining unit 204. Given the maximum of the Y-axis direction address determined to be 10, equation (2) is rewritten into equation (3).

$$yadr = \Delta\sqrt{p} \times 10/200 \times \text{normalization multiplying factor} \quad (3)$$

According to equation (3), when the amplitude difference $\Delta\sqrt{p}$ varies within a range of −200 to 200, the Y-axis direction address takes values ranging from −10 to 10 when the normalization multiplying factor is 1. The Y-axis direction address is thus distributed throughout the entire range of values of (−10 to 10) for the variation of a state of the input signal (amplitude difference $\Delta\sqrt{p}$). When the amplitude difference $\Delta\sqrt{p}$ varies within a range of −100 to 100, on the other hand, the Y-axis direction address takes values ranging from −5 to 5 when the normalization multiplying factor is 1. The Y-axis direction address is thus distributed in a narrower range with respect to the state variation of the input signal (amplitude difference $\Delta\sqrt{p}$).

In such a case, the normalizing range determining unit 204 determines the normalization multiplying factor to be, for example, 2, based on the X-axis direction address and the table 600. In this case, the Y-axis direction address takes values within the range of −10 to 10 even when the amplitude difference $\Delta\sqrt{p}$ varies within the range of −100 to 100. As a result, the Y-axis direction address is distributed throughout the entire range of values of (−10 to 10) with respect to the state variation of the input signal (amplitude difference $\Delta\sqrt{p}$).

The range in which the amplitude difference $\Delta\sqrt{p}$ can vary changes depending on, for example, the power p, the amplitude $\sqrt{p}$, or the logarithmic value $\log_e p$ of the input signal (X-axis direction address). By expanding the normalizing range according to the X-axis direction address, a distribution of the Y-axis direction address can be widened properly according to the range in which the amplitude difference $\Delta\sqrt{p}$ can vary. This improves the resolution of the Y-axis direction address, enabling accurate identification of the state of the signal by the Y-axis direction address. Hence, a proper distortion compensation coefficient can be selected from the table managing unit 114 for compensation of signal distortion caused by the memory effect to accurately compensate the signal distortion caused by the memory effect.

FIG. 7 is a graph of a distribution of both addresses before expansion of the normalizing range. In FIG. 7, the vertical axis represents the X-axis direction address, while the horizontal axis represents the Y-axis direction address that results after normalization of the amplitude difference $\Delta\sqrt{p}$. A hatched area 700 represents a distribution of the X-axis direction address and the Y-axis direction address for the variation of the input signal to the distortion compensating apparatus 110, a distribution that results before expansion of the normalizing range. As depicted by the hatched area 700, the distribution range of the Y-axis direction address becomes narrower in a range of 700 to 875 of the X-axis direction address.

Figure 8:
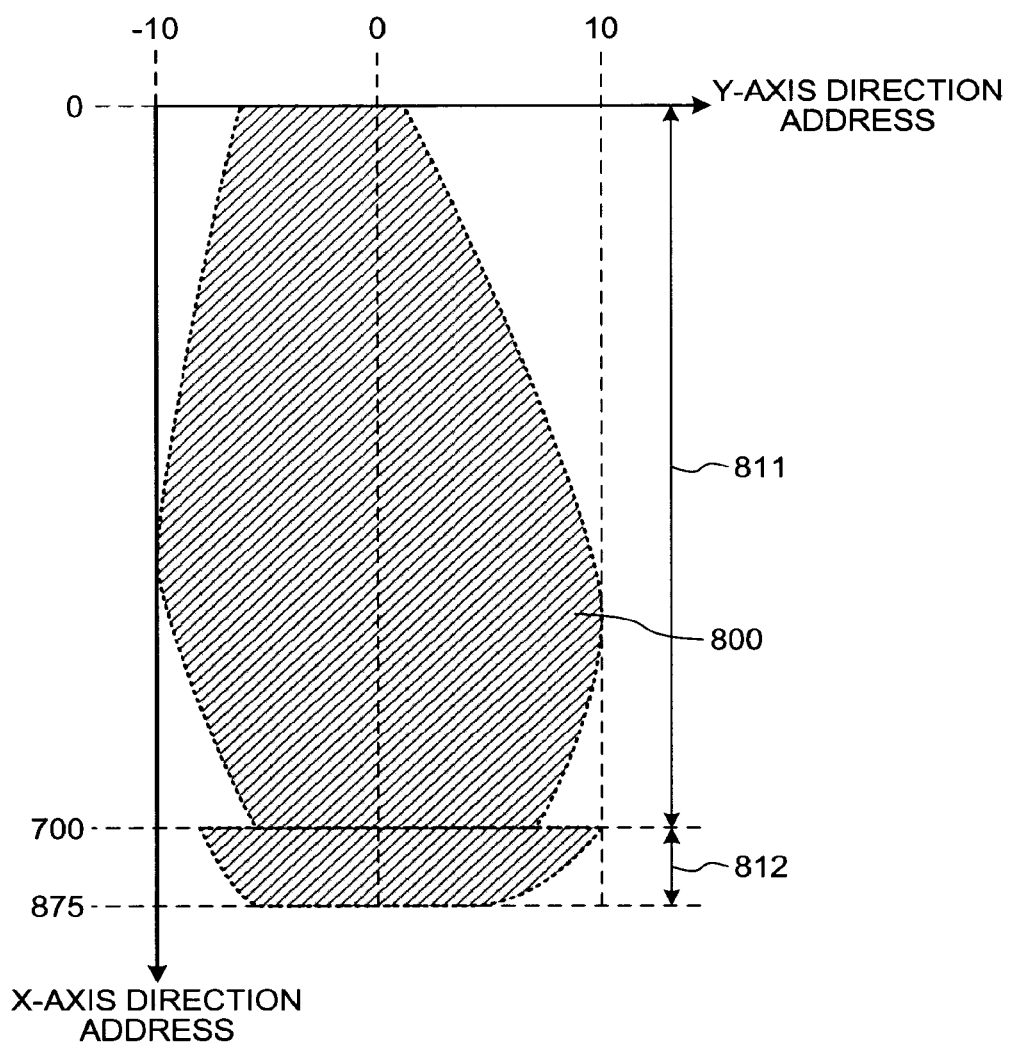
FIG. 8 is a graph of a distribution of both addresses after expansion of the normalizing range.

FIG. 8 is a graph of a distribution of both addresses after expansion of the normalizing range. A hatched area 800 represents a distribution of the X-axis direction address and the Y-axis direction address for the variation of the input signal to the distortion compensating apparatus 110, a distribution that results after expansion of the normalizing range. As depicted by the hatched area 800, the normalizing range determining unit 204 determines the normalizing range to be 1 (normalization multiplying factor=1) (see FIG. 6) in a range 811 of 0 to 699 of the X-axis direction address.

The normalizing range determining unit 204 expands the normalizing range to 2 (normalization multiplying factor=2) (see FIG. 6) in a range of 700 to 875 of the X-axis direction address. As a result, in the range 812 of 700 to 875 of the X-axis direction address, the distribution range of the Y-axis direction address becomes wider than the distribution range before the normalizing range expansion (see FIG. 7). Hence, the resolution of the Y-axis direction address is improved in the range of 700 to 875 of the X-axis direction address.

In this manner, the distortion compensating apparatus 110 of the second embodiment determines a normalizing range for the Y-axis direction address according to the electrical power of the input signal and thus, is capable of distributing the Y-axis direction address according to the state of the input signal (amplitude difference $\Delta\sqrt{p}$). This enables accurate identification of the state of the input signal by the Y-axis direction address and thus, enables the selection of a proper distortion compensation coefficient from the table managing unit 114 according to the state of input signal.

As a result, nonlinear signal distortion caused by the memory effect at the amplifier 120 is compensated accurately. Thus, when electrical power efficiency is improved using, for example, the amplifier 120 inferior in linearity, nonlinear signal distortion is compensated accurately to reduce electrical power leakage to adjacent channels.

The distortion compensating apparatus 110 according to a third embodiment has the same configuration as depicted in FIG. 1. The address generating unit 112 of the distortion compensating apparatus 110 according to the third embodiment, however, calculates a phase difference $\Delta\theta$ between different points of time of the signal x(t) and generates an address uniquely corresponding to the calculated phase difference $\Delta\theta$ as the Y-axis direction address (second address).

Figure 9:
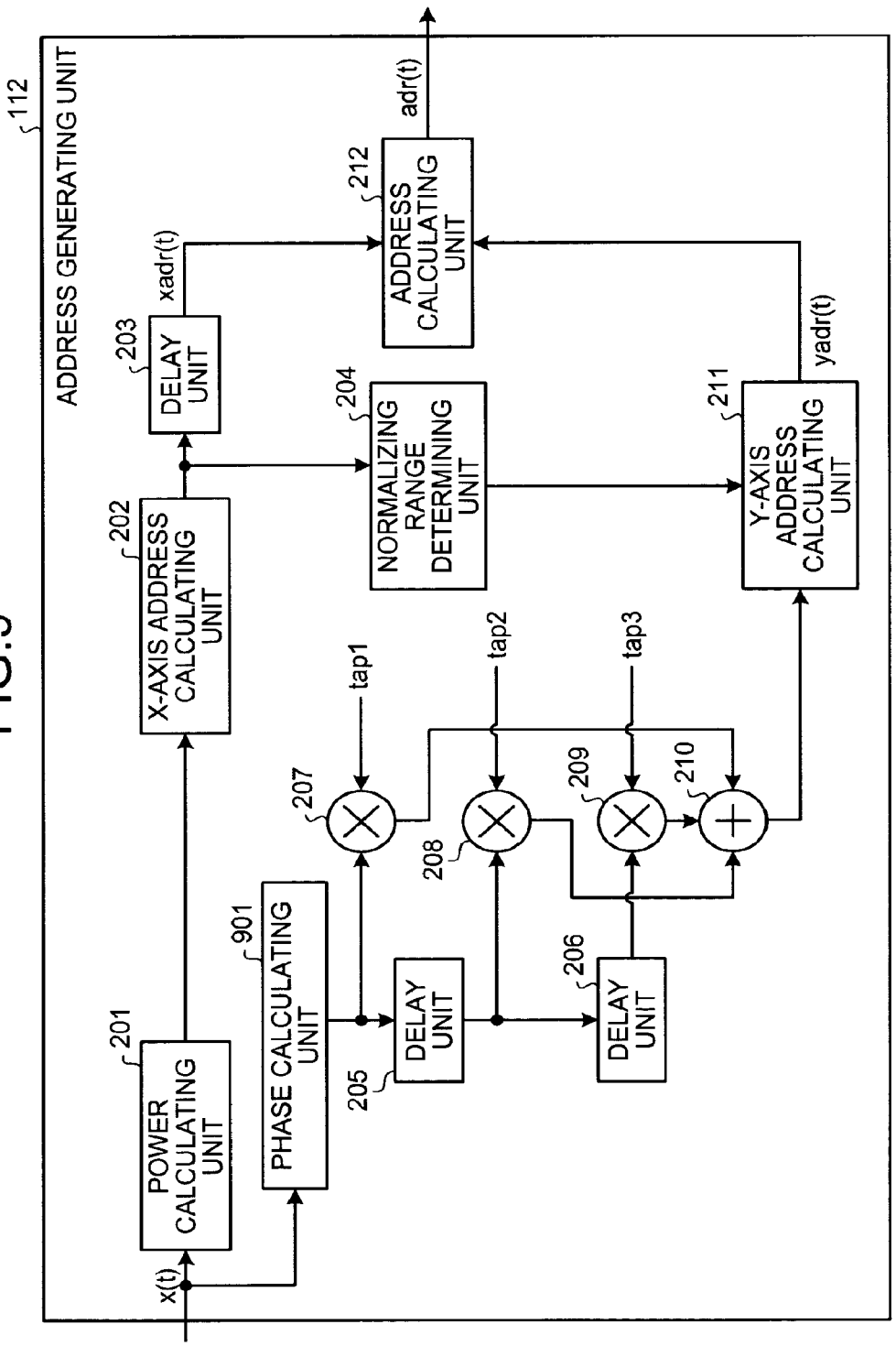
FIG. 9 is a block diagram of an example of the address generating unit according to the third embodiment.

FIG. 9 is a block diagram of an example of the address generating unit according to the third embodiment. In FIG. 9, constituent elements identical to those depicted in FIG. 2 are denoted by the same reference numerals used in FIG. 2 and will be omitted in further description. As depicted in FIG. 9, the address generating unit 112 according to the third embodiment includes a phase calculating unit 901, in addition to the configuration depicted in FIG. 2. The input signal x(t) to the address generating unit 112 is input to the power calculating unit 201 and to the phase calculating unit 901.

The phase calculating unit 901 calculates the phase of the input signal x(t). If the phase calculating unit 901 is implemented in the form of hardware, a cordic method or a table lookup method is used as a method of calculating the phase. If the phase calculating unit 901 is implemented in the form of software, an integrated phase calculation function may be adopted, in addition to a cordic method and a table lookup method. The phase calculating unit 901 outputs phase information indicative of the calculated phase to the delay unit 205 and to the multiplying unit 207.

The delay unit 205 delays the phase information output from the phase calculating unit 901 by one sample and outputs the delayed phase information to the delay unit 206 and to the multiplying unit 208. The delay unit 206 delays the phase information output from the delay unit 205 by one sample and outputs the delayed phase information to the multiplying unit 209.

The multiplying unit 207 multiplies the phase information output from the phase calculating unit 901 by the tap coefficient tap1 and outputs the resulting phase information to the adding unit 210. The multiplying unit 208 multiplies the phase information output from the delay unit 205 by the tap coefficient tap2 and outputs the resulting phase information to the adding unit 210. The multiplying unit 209 multiplies the phase information output from the delay unit 206 by the tap coefficient tap3 and outputs the resulting phase information to the adding unit 210.

In this case, the sum by the adding unit 210 represents phase differences $\Delta\theta$ between three different points of time (e.g., past, present, and future) of the signal X(t). While a case of calculating the phase differences $\Delta\theta$ between three points of time is described, phase differences $\Delta\theta$ between other points of time, such as two or four or more points of time, may also be calculated. The adding unit 210 outputs the sum as phase difference information to the Y-axis address calculating unit 211, which normalizes the phase difference information output from the adding unit 210 to calculate the Y-axis direction address.

Hence, the distortion compensating apparatus 110 is able to compensate distortion, based on the LUT 114a, using a two-dimensional address corresponding to the power p of the signal x(t) and the phase difference $\Delta\theta$, thereby lowering a side lobe of the frequency spectrum of an output waveform from the amplifier 120 to reduce electrical power leakage to adjacent channels.

The power calculating unit 201 of FIG. 9 may be replaced with the amplitude calculating unit 301 (see FIG. 3), or may be replaced with the logarithmic electrical power calculating unit 401 (see FIG. 4).

Figures 10, 11:
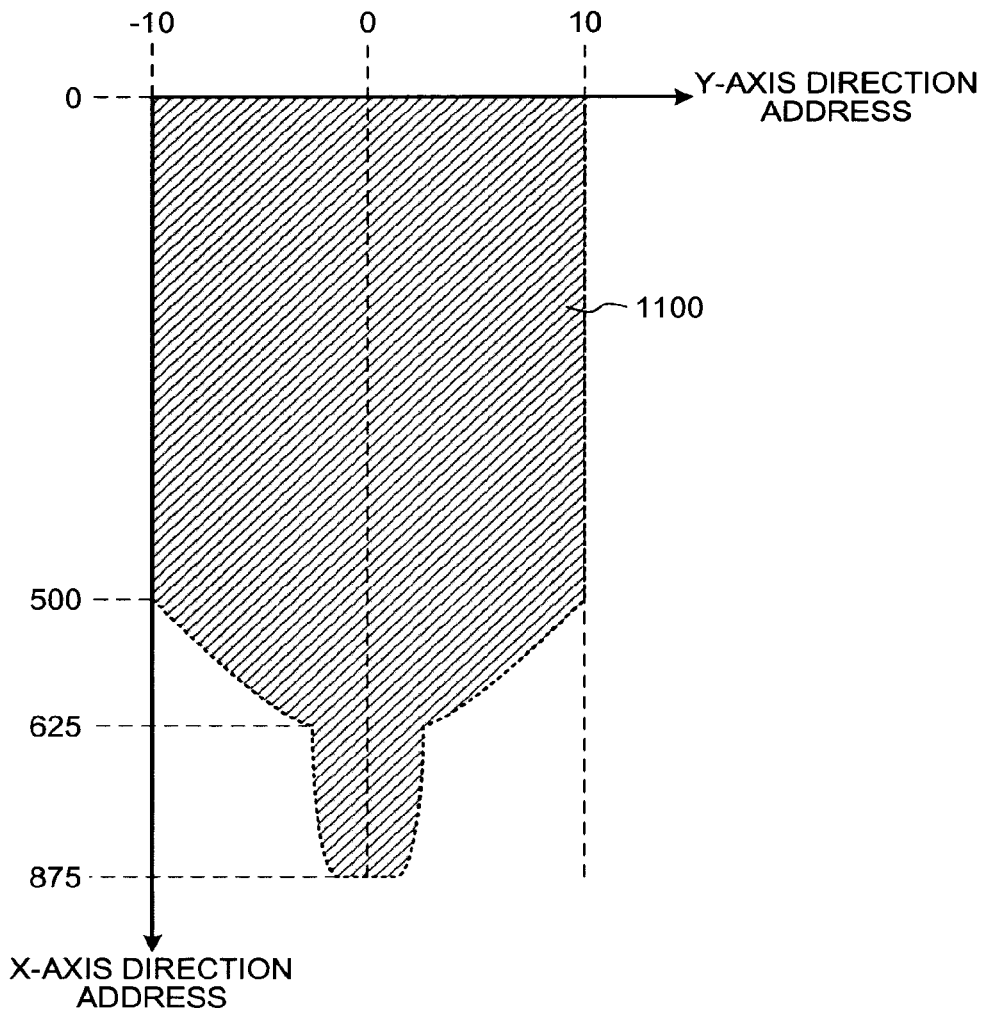
FIG. 10 depicts an example of correlation information indicative of the correlation between X-axis direction addresses and normalizing ranges.
FIG. 11 is a graph of a distribution of both addresses before expansion of the normalizing range.

FIG. 10 depicts an example of correlation information indicative of the correlation between X-axis direction addresses and normalizing ranges. In this example, the minimum of the X-axis direction address is determined to be 0 while the maximum is determined to be 875, and the minimum of the Y-axis direction address is determined to be −10 while the maximum is determined to be 10. The memory (correlation information memory unit) of the distortion compensating apparatus 110, for example, stores therein a table 1000 depicted in FIG. 10. In the table 1000, each range of the X-axis direction address is correlated with a normalization multiplying factor.

Specifically, a range of 0 to 574 of the X-axis direction address is correlated with the normalization multiplying factor of 1.0. When the normalization multiplying factor is 1.0, the Y-axis direction address of 10 is equivalent to the phase difference $\Delta\theta$ of 360 degrees. A range of 575 to 624 of the X-axis direction address is correlated with the normalization multiplying factor of 2.0. When the normalization multiplying factor is 2.0, the Y-axis direction address of 10 is equivalent to the phase difference $\Delta\theta$ of 180 degrees. A range of 625 to 875 of the X-axis direction address is correlated with a normalization multiplying factor of 4.0. When the normalization multiplying factor is 4.0, the Y-axis direction address of 10 is equivalent to the phase difference $\Delta\theta$ of 90 degrees.

The normalizing range determining unit 204 acquires from the table 1000, the normalization multiplying factor correlated with the X-axis direction address output from the X-axis address calculating unit 202. The normalizing range determining unit 204 provides the acquired normalization multiplying factor to the Y-axis address calculating unit 211, which calculates the Y-axis direction address based on, for example, equation (4).

$$yadr = \Delta\theta \times yadrMAX/360 \times \text{normalization multiplying factor} \quad (4)$$

In equation (4), yadr denotes the Y-axis direction address, $\Delta\theta$ denotes the phase difference $\Delta\theta$ indicated by phase difference information, yadrMAX denotes the maximum of the Y-axis direction address, 360 denotes the maximum that the phase difference Δθ can take, and normalization multiplying factor represents the normalization multiplying factor provided by the normalizing range determining unit 204. Given the maximum of the Y-axis direction address determined to be 10, equation (4) is rewritten into equation (5).

$$yadr = \Delta\theta \times 10/360 \times \text{normalization multiplying factor} \quad (5)$$

According to equation (5), when the phase difference Δθ varies within a range of −360 degrees to 360 degrees, the Y-axis direction address takes values ranging from −10 to 10 when the normalization multiplying factor is 1. The Y-axis direction address is thus distributed throughout the entire range of values of (−10 to 10) with respect to the state variation of the input signal (phase difference Δθ). When the phase difference Δθ varies within a range of −180 degrees to 180 degrees, on the other hand, the Y-axis direction address takes values ranging from −5 to 5 when the normalization multiplying factor is 1. The Y-axis direction address is thus distributed in a narrower range with respect to the state variation of the input signal (phase difference Δθ).

In such a case, the normalizing range determining unit 204 determines the normalization multiplying factor to be, for example, 2, based on the X-axis direction address and the table 1000. In this case, the Y-axis direction address takes values within the range of −10 to 10 even when the phase difference Δθ varies within the range of −180 degrees to 180 degrees. As a result, the Y-axis direction address is distributed throughout the entire range of values of (−10 to 10) with respect to the state variation of the input signal (phase difference Δθ).

The range in which the phase difference Δθ can vary changes depending on, for example, the power p, the amplitude √p, or the logarithmic value logep of the input signal (X-axis direction address). By expanding the normalizing range according to the X-axis direction address, a distribution of the Y-axis direction address can be widened properly according to the range in which the phase difference Δθ can vary. This improves the resolution of the Y-axis direction address, enabling accurate identification of the state of the signal by the Y-axis direction address. Hence, a proper distortion compensation coefficient can be selected from the table managing unit 114 for compensation of signal distortion caused by the memory effect, to accurately compensate the signal distortion caused by the memory effect.

FIG. 11 is a graph of a distribution of both addresses before expansion of the normalizing range. In FIG. 11, the vertical axis represents the X-axis direction address, while the horizontal axis represents the Y-axis direction address (phase difference) that results after normalization of the phase difference Δθ. A hatched area 1100 represents a distribution of the X-axis direction address and the Y-axis direction address for the variation of the input signal to the distortion compensating apparatus 110, a distribution that results before expansion of the normalizing range. As depicted by the hatched area 1100, the distribution range of the Y-axis direction address becomes narrower in a range of 500 to 624 of the X-axis direction address as compared to a range of 0 to 499 of the X-axis direction address. Further, in a range of 625 to 875 of the X-axis direction address, the distribution range of the Y-axis direction address becomes further narrower.

Figure 12:
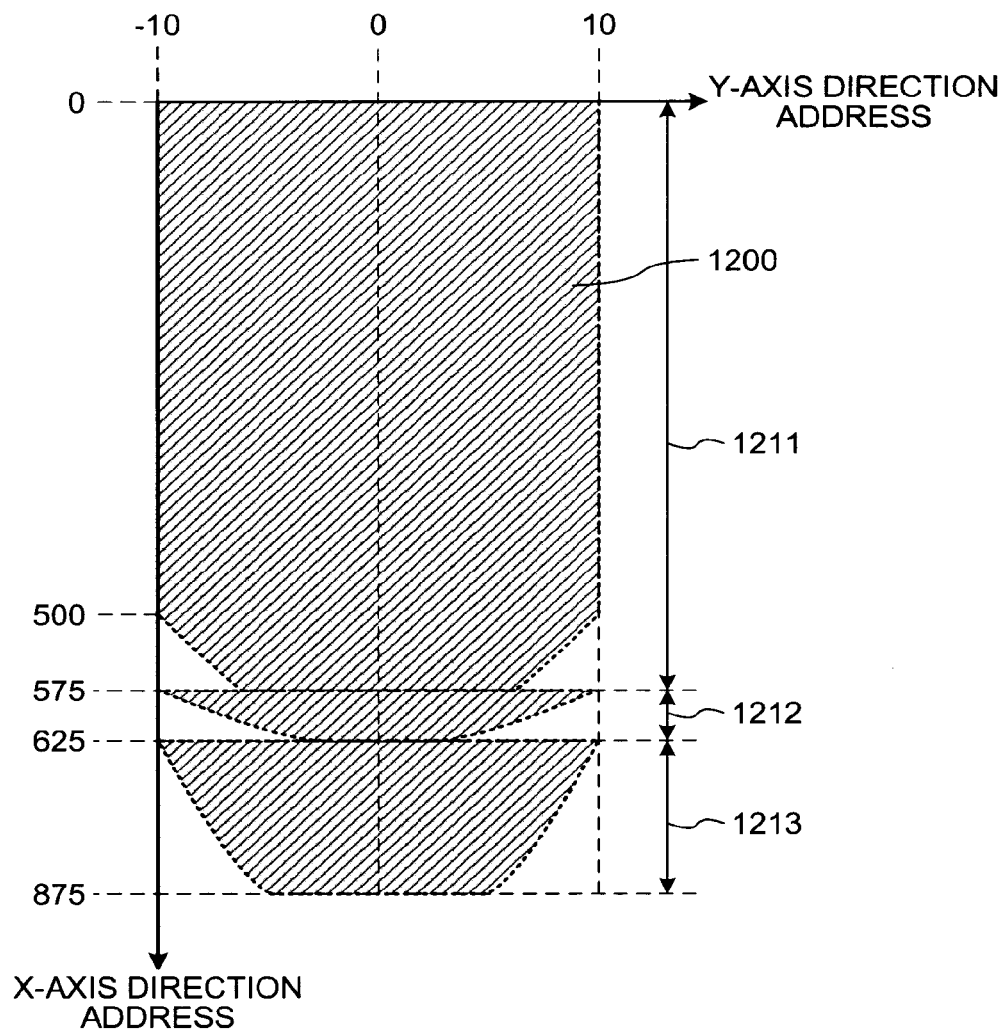
FIG. 12 is a graph of a distribution of both addresses after expansion of the normalizing range.

FIG. 12 is a graph of a distribution of both addresses after expansion of the normalizing range. A hatched area 1200 represents a distribution of the X-axis direction address and the Y-axis direction address with respect to the variation of the input signal to the distortion compensating apparatus 110, after expansion of the normalizing range. The normalizing range determining unit 204 determines the normalizing range to be 1 (normalization multiplying factor=1.0) (see FIG. 10) in a range 1211 of 0 to 574 of the X-axis direction address.

The normalizing range determining unit 204 expands the normalizing range to 2 (normalization multiplying factor=2.0) (see FIG. 10) in a range 1212 of 575 to 624 of the X-axis direction address. As a result, in the range 1212, the distribution range of the Y-axis direction address becomes wider than the distribution range before the normalizing range expansion (see FIG. 11). Further, the normalizing range determining unit 204 expands the normalizing range to 4 (normalization multiplying factor=4.0) (see FIG. 10) in a range 1213 of 625 to 875 of the X-axis direction address. As a result, in the range 1213, the distribution range of the Y-axis direction address becomes wider than the distribution range before the normalizing range expansion (see FIG. 11).

In this manner, a normalizing range for the Y-axis direction address is determined according to the X-axis direction address, thereby widening the distribution range of the Y-axis direction address in each range of the X-axis direction address and improving the resolution of the Y-axis direction address. Hence, the state of an input signal (phase difference Δθ) can be identified accurately by the Y-axis direction address.

If the Y-axis address is generated based on the phase difference Δθ, the distribution range of the Y-axis direction address becomes extremely narrow in some ranges of the X-axis direction address (e.g., in the range 1213), as depicted in FIGS. 12 and 11. In such a case, the normalizing range is expanded according to the X-axis direction address to significantly improve the resolution of the Y-axis direction address.

Figure 13:
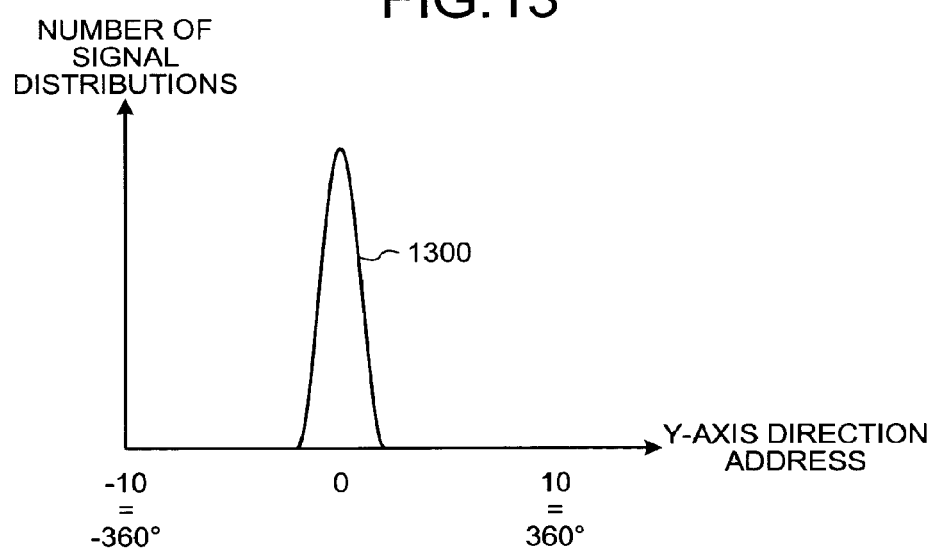
FIG. 13 is a graph of a distribution of a Y-axis direction address before expansion of the normalizing range.

FIG. 13 is a graph of a distribution of the Y-axis direction address before expansion of the normalizing range. In FIG. 13, the horizontal axis represents the Y-axis direction address, while the vertical axis represents the number of signal (input signal) distributions. A characteristic 1300 represents the number of signal distributions for each Y-axis direction address when the X-axis direction address is 875 and the normalization multiplying factor is 1.0. As indicated by the characteristic 1300, the distribution range of the Y-axis direction address is narrow before expansion of the normalizing range.

Figure 14:
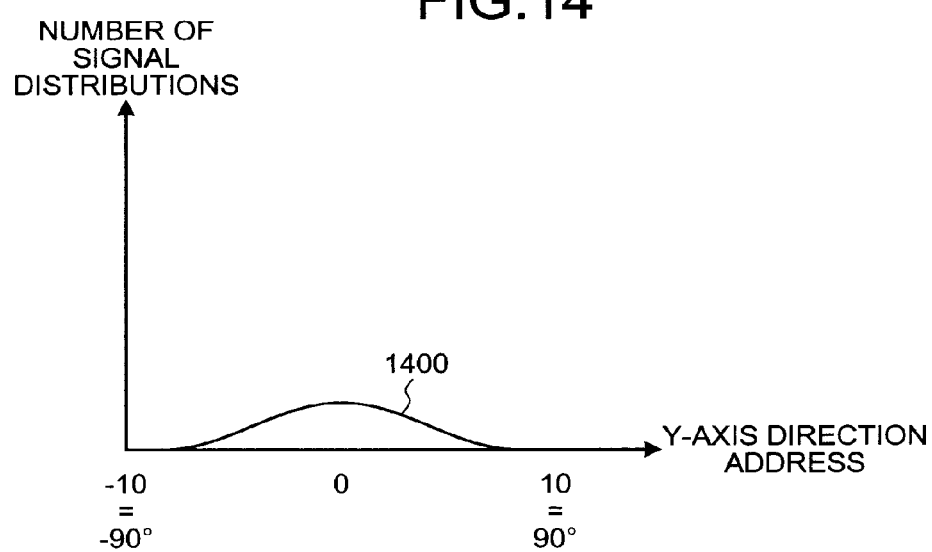
FIG. 14 is a graph of a distribution of the Y-axis direction address after expansion of the normalizing range.

FIG. 14 is a graph of a distribution of the Y-axis direction address after expansion of the normalizing range. A characteristic 1400 represents the number of signal distributions for each Y-axis direction address when the X-axis direction address is 875 and the normalization multiplying factor is 4.0. As depicted by the characteristic 1400, the normalizing range is expanded fourfold (normalization multiplying factor=4.0) to make the distribution range of the Y-axis direction address wider than the distribution range before the normalizing range expansion (FIG. 13).

FIGS. 13 and 14 depict distributions of the Y-axis direction address in the case of generating the Y-axis direction address based on the phase difference Δθ. In the same manner as in FIGS. 13 and 14, when the Y-axis direction address is generated based on the power difference Δp or the amplitude difference Δ√p (the first and the second embodiments), the distribution range of the Y-axis direction address can be widened by expanding the normalizing range.

In this manner, the distortion compensating apparatus 110 according to the third embodiment determines a normalizing range for the Y-axis direction address according to the electrical power of an input signal, thereby enabling distribution of the Y-axis direction address for a state of the input signal (e.g., phase difference Δθ) and accurate identification of the state of the input signal by the Y-axis direction address. Consequently, a proper distortion compensation coefficient can be selected from the table managing unit 114 according to the state of input signal.

As a result, nonlinear signal distortion caused by the memory effect at the amplifier 120 is compensated accurately. Thus, when electrical power efficiency is improved using, for example, the amplifier 120 inferior in linearity, nonlinear signal distortion is compensated accurately to reduce electrical power leakage to adjacent channels.

The distortion compensating apparatus 110 according to a fourth embodiment has the same configuration as depicted in FIG. 1. The address generating unit 112 of the distortion compensating apparatus 110 according to the fourth embodiment, however, generates a third address for which a normalizing range is determined according to the electrical power of an input signal.

Figure 15:
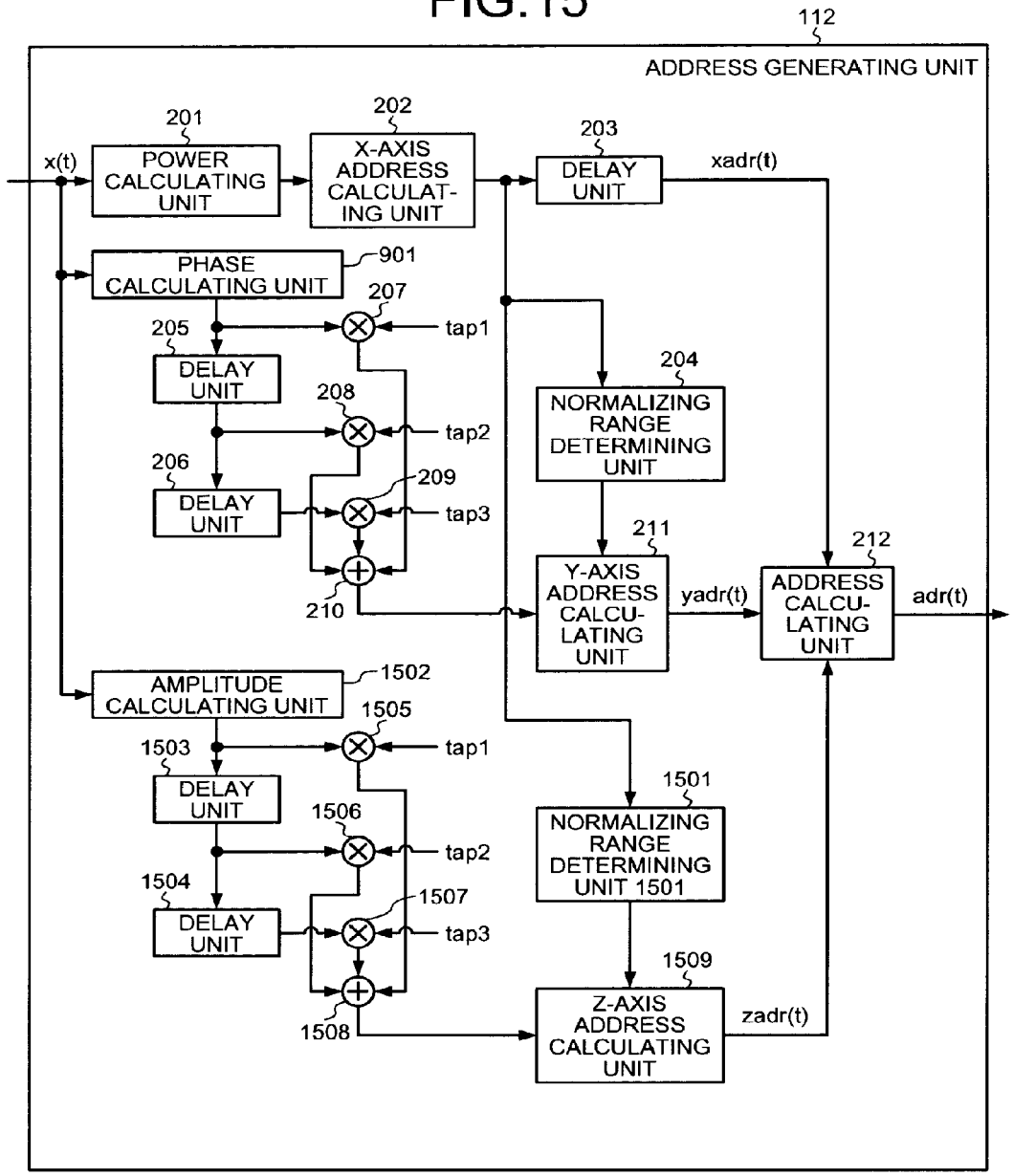
FIG. 15 is a block diagram of an example of the address generating unit according to a fourth embodiment.

FIG. 15 is a block diagram of an example of the address generating unit according to the fourth embodiment. In FIG. 15, constituent elements identical to those depicted in FIG. 9 are denoted by the same reference numerals used in FIG. 9 and will be omitted in further description. As depicted in FIG. 15, the address generating unit 112 according to the fourth embodiment includes a normalizing range determining unit 1501, an amplitude calculating unit 1502, delay units 1503 and 1504, multiplying units 1505 to 1507, an adding unit 1508, and a Z-axis address calculating unit 1509, in addition to the configuration depicted in FIG. 9. The input signal x(t) to the address generating unit 112 is input to the power calculating unit 201, to the phase calculating unit 901, and to the amplitude calculating unit 1502.

The X-axis address calculating unit 202 outputs the calculated X-axis direction address to the delay unit 203, to the normalizing range determining unit 204, and to the normalizing range determining unit 1501. The normalizing range determining unit 1501 determines a normalizing range in the normalization of the Z-axis direction address by the Z-axis address calculating unit 1509. Specifically, the normalizing range determining unit 1501 determines a normalization multiplying factor based on the X-axis direction address output from the X-axis address calculating unit 202. The normalizing range determining unit 204 provides the determined normalization multiplying factor to the Z-axis address calculating unit 1509.

For example, the memory (correlation information memory unit) of the distortion compensating apparatus 110 preliminarily stores therein correlation information correlating the X-axis direction address with normalization multiplying factors (normalizing ranges). The normalizing range determining unit 1501 acquires a normalization multiplying factor correlated with the X-axis direction address from the correlation information, and provides the acquired normalization multiplying factor to the Z-axis address calculating unit 1509.

Based on the amplitude of the input signal, the amplitude calculating unit 1502, the delay units 1503 and 1504, the multiplying units 1505 to 1507, the adding unit 1508, and the Z-axis address calculating unit 1509 generate the third address for acquiring a distortion compensation coefficient from the LUT 114a. Specifically, the amplitude calculating unit 1502 calculates the amplitude $\sqrt{p}$ of the input signal x(t) and outputs amplitude information indicative of the calculated amplitude $\sqrt{p}$ to the delay unit 1503 and to the multiplying unit 1505.

The delay unit 1503 delays the amplitude information output from the amplitude calculating unit 1502 by one sample and outputs the delayed amplitude information to the delay unit 1504 and to the multiplying unit 1506. The delay unit 1504 delays the amplitude information output from the delay unit 1503 by one sample and outputs the delayed amplitude information to the multiplying unit 1507. The multiplying unit 1505 multiplies the amplitude information output from the amplitude calculating unit 1502 by a tap coefficient tap11 and outputs the resulting amplitude information to the adding unit 1508. The multiplying unit 1506 multiplies the amplitude information output from the delay unit 1503 by a tap coefficient tap12 and outputs the resulting amplitude information to the adding unit 1508. The multiplying unit 1507 multiplies the amplitude information output from the delay unit 1504 by a tap coefficient tap13 and outputs the resulting amplitude information to the adding unit 1508.

The adding unit 1508 adds up the signals output from the multiplying units 1505 to 1507. The sum obtained by the adding unit 1508 represents amplitude differences $\Delta\sqrt{p}$ between three different points of time (e.g., past, present, and future) of the signal X(t). While a case of calculating the amplitude differences $\Delta\sqrt{p}$ between three points of time is described, amplitude differences $\Delta\sqrt{p}$ between other points of time, such as two or four or more points of time, may be calculated. The adding unit 1508 outputs the addition result as amplitude difference information to the Z-axis address calculating unit 1509.

The Z-axis address calculating unit 1509 normalizes the amplitude difference information output from the adding unit 1508 to calculate the Z-axis direction address, where the Z-axis address calculating unit 1509 uses the normalization multiplying coefficient provided by the normalizing range determining unit 1501 to carry out the normalization. The Z-axis address calculating unit 1509 outputs the calculated Z-axis direction address to the address calculating unit 212. For example, the Z-axis address calculating unit 1509 calculates the Z-axis direction address using equation (3), where normalization multiplying factor represents the normalization multiplying factor provided by the normalizing range determining unit 1501.

The address calculating unit 212 synthesizes the X-axis direction address (xadr(t)) from the delay unit 203, the Y-axis direction address (yadr(t)) from the Y-axis address calculating unit 211, and the Z-axis direction address (zadr(t)) from the Z-axis address calculating unit 1509.

Hence, the distortion compensating apparatus 110 is able to perform distortion compensation based on the LUT 114a, using a three-dimensional address corresponding to the power p, the phase difference $\Delta\theta$, and the amplitude difference $\Delta\sqrt{p}$ of the signal x(t), thereby lowering a side lobe of the frequency spectrum of an output waveform from the amplifier 120 to reduce electrical power leakage to adjacent channels.

The described configuration is such that the normalizing range determining unit 1501 determines a normalization multiplying factor based on the X-axis direction address, but a configuration other than such a configuration is possible. For example, the normalizing range determining unit 1501 may acquire the power information output from the power calculating unit 201 to determine a normalization multiplying factor based on the acquired power information.

In this case, for example, the memory of the distortion compensating apparatus 110 preliminarily stores therein correlation information correlating the power information with normalization multiplying factors. The normalizing range determining unit 1501 acquires from the correlation information, a normalization multiplying factor correlated with the power information output from the power calculating unit 201, and provides the acquired normalization multiplying factor to the Y-axis address calculating unit 211.

The power calculating unit 201 depicted in FIG. 15 may be replaced with the amplitude calculating unit 301 (see FIG. 3), or may be replaced with the logarithmic electrical power calculating unit 401 (see FIG. 4).

The delay rate at each of the delay units 203, 205, 206, 1503, and 1504 is not limited to a delay time equivalent to one sample of the signal x(t). For example, the delay rate at each of the delay units 203, 205, 206, 1503, and 1504 may be determined to be a delay time equivalent to ½ or 2 times one sample of the signal x(t).

For example, the delay rate at each of the delay units 203, 205, and 1503 is set so that the power information output from the power calculating unit 201, the phase information output from the multiplying unit 208, and the amplitude information output from the multiplying unit 1506 match in timing. As a result, the phase information output from the multiplying unit 208 is used as a reference for the Y-axis direction address while the amplitude information output from the multiplying unit 1506 is used as a reference for the Z-axis direction address to match the output timing of the X-axis direction address, the output timing of the Y-axis direction address, and the output timing of the Z-axis direction address with each other.

In this manner, the distortion compensating apparatus 110 according to the fourth embodiment achieves the same effects as those achieved by the first to the third embodiments, and is capable of more accurately compensating nonlinear signal distortion by using the LUT 114a in which distortion compensation coefficients are associated with addresses through three-dimensional values including the phase difference Δθ.

Figure 16:
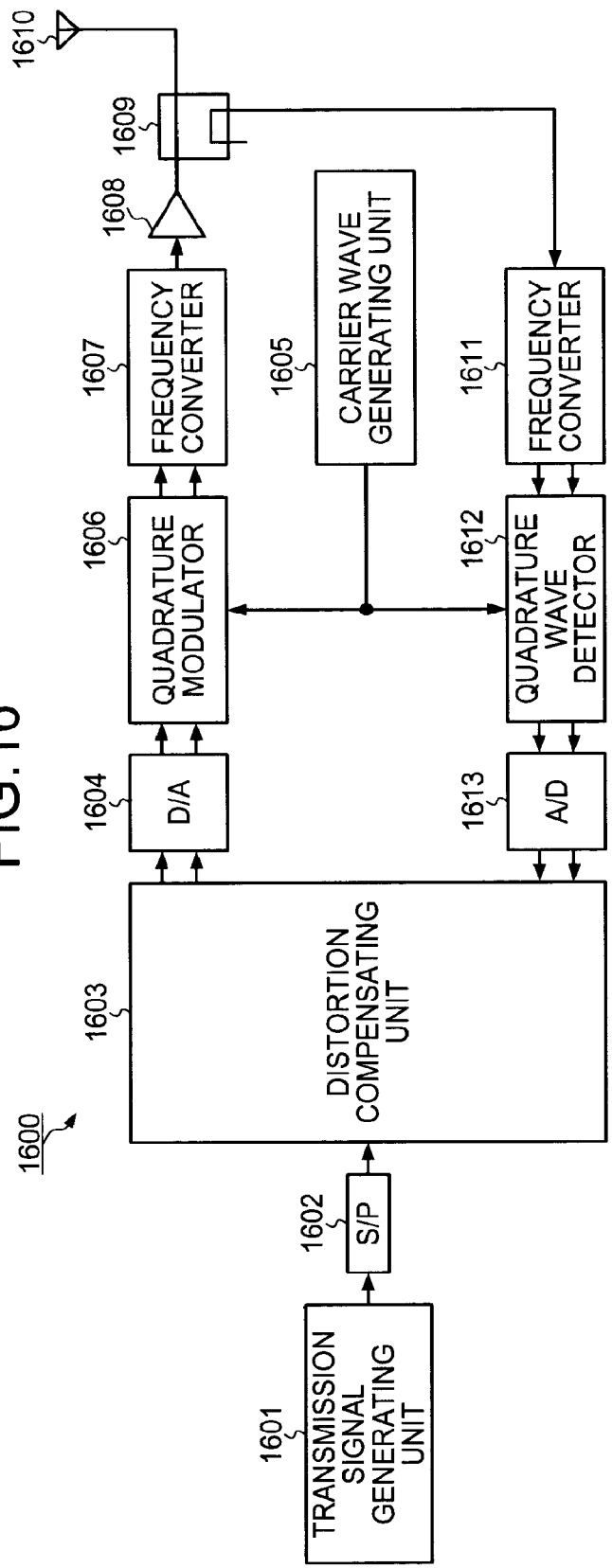
FIG. 16 is a block diagram of an example of a transmitting system according to a fifth embodiment.

FIG. 16 is a block diagram of an example of a transmitting system according to a fifth embodiment. A transmitting system 1600 according to the fifth embodiment carries out digital nonlinear distortion compensation based on the adaptive LMS algorithm. As depicted in FIG. 16, the transmitting system 1600 includes a transmission signal generating unit 1601, a parallel converter 1602, a distortion compensating unit 1603, an analog converter 1604, a carrier wave generating unit 1605, a quadrature modulator 1606, a frequency converter 1607, an amplifier 1608, a directional coupler 1609, an antenna 1610, a frequency converter 1611, an quadrature wave detector 1612, and a digital converter 1613.

The transmission signal generating unit 1601 generates a digital transmission signal (serial signal) and outputs the digital transmission signal to the parallel converter 1602. The parallel converter 1602 alternately divides the transmission signal output from the transmission signal generating unit 1601 bit by bit to convert the transmission signal into two types of parallel signals consisting of an I signal (in-phase component) and a Q signal (quadrature component). The parallel converter 1602 outputs the converted I signal and Q signal to the distortion compensating unit 1603.

The distortion compensating unit 1603 carries out digital nonlinear distortion compensation on the I signal and Q signal output from the parallel converter 1602. Specifically, the distortion compensating unit 1603 compares the pre-compensation transmission signals output from the parallel converter 1602 with feedback signals that have been demodulated by the quadrature wave detector 1612 and output from the digital converter 1613. The distortion compensating unit 1603 then calculates a distortion compensation coefficient so that differences between the compared signals become zero. The distortion compensating unit 1603 outputs the I signal and Q signal that have been subjected to digital nonlinear distortion compensation to the analog converter 1604.

The analog converter 1604 converts the I signal and Q signal output from the distortion compensating unit 1603 into analog base band signals and outputs the base band signals to the quadrature modulator 1606. The carrier wave generating unit 1605 generates reference carrier waves, and outputs the generated carrier waves to the quadrature modulator 1606 and to the quadrature wave detector 1612.

The quadrature modulator 1606 carries out quadrature modulation of the reference carrier waves output from the carrier wave generating unit 1605, based on the I signal and Q signal output from the analog converter 1604. Specifically, the quadrature modulator 1606 multiplies each of the reference carrier waves, which differ in phase by 90 degrees from each other, by the I signal and Q signal and sums the results in carrying out quadrature modulation. The quadrature modulator 1606 outputs the quadrature modulated signals resulting from quadrature modulation, to the frequency converter 1607.

The frequency converter 1607 mixes the quadrature modulated signals output from the quadrature modulator 1606 with a local oscillation signal to frequency convert the quadrature modulated signals. The frequency converter 1607 outputs radio frequency signals resulting from the frequency conversion to the amplifier 1608, which is a transmission electrical power amplifier that amplifies the electrical power of the radio frequency signals output from the frequency converter 1607. The amplifier 1608 outputs the amplified radio frequency signals to the directional coupler 1609.

The directional coupler 1609 branches the radio frequency signals output from the amplifier 1608 and outputs one branched portion of radio frequency signals to the antenna 1610 and another branched portion of radio frequency signals to the frequency converter 1611. The antenna 1610 is a transmitting unit that emits the radio frequency signals output from the directional coupler 1609 into air. Hence, the radio frequency signals are sent out by radio transmission.

The frequency converter 1611 converts the radio frequency signals output from the directional coupler 1609, based on a local oscillation signal. The frequency converter 1611 outputs the quadrature modulated signals resulting from the frequency conversion to the quadrature wave detector 1612.

The quadrature wave detector 1612 carries out quadrature wave detection on the quadrature modulated signals output from the frequency converter 1611 by multiplying the quadrature modulated signals by each of the reference carrier waves that differ in phase by 90 degrees from each other. The quadrature wave detector 1612 outputs the I signal and Q signal resulting from the quadrature wave detection to the digital converter 1613, which converts the I signal and Q signal output from the quadrature wave detector 1612 into digital signals and outputs the digital signals to the distortion compensating unit 1603.

The distortion compensating apparatus 110 depicted in FIG. 1 corresponds to, for example, the distortion compensating unit 1603. The amplifier 120 depicted in FIG. 1 corresponds to, for example, the amplifier 1608. The feedback line 130 depicted in FIG. 1 corresponds to, for example, the directional coupler 1609, the frequency converter 1611, the quadrature wave detector 1612, and the digital converter 1613.

Figure 17:
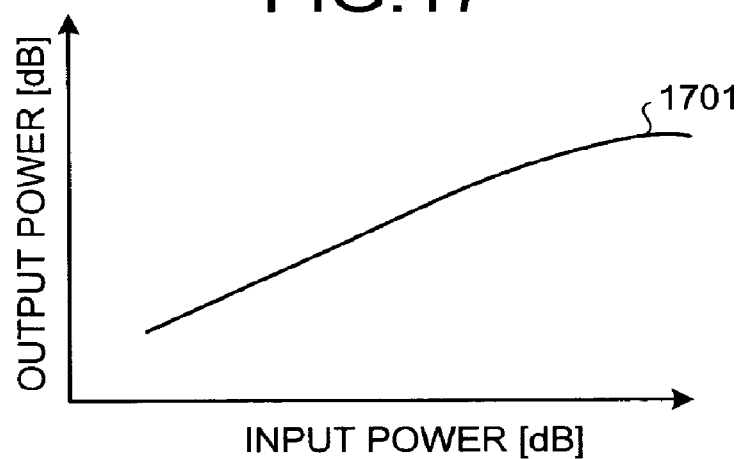
FIG. 17 is a graph of the input/output characteristics of an amplifier.

FIG. 17 is a graph of the input/output characteristics of the amplifier. In FIG. 17, the horizontal axis represents input electrical power [dB] to the amplifier 1608, while the vertical axis represents output electrical power [dB] from the amplifier 1608. Input/output characteristics 1701 represent the input/output characteristics of the amplifier 1608. In mobile communication, such as W-CDMA, the transmission power of the transmitting system is large, ranging from ten [mW] to scores [W], whereby the input/output characteristics 1701 of the amplifier 1608 becomes nonlinear.

Figure 18:
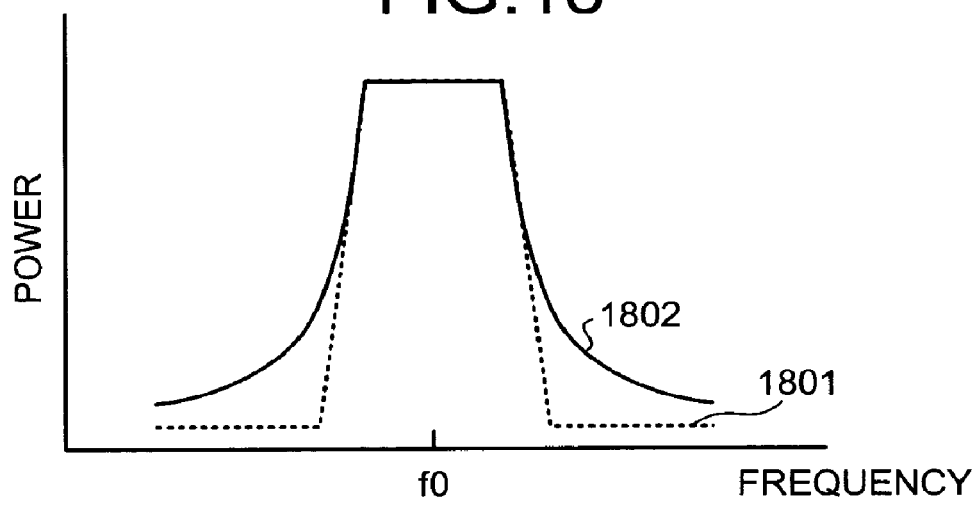
FIG. 18 depicts signal distortion caused by nonlinearity of the input/output characteristics of the amplifier.

FIG. 18 depicts signal distortion caused by the nonlinearity of the input/output characteristics of the amplifier. In FIG. 18, the horizontal axis represents the frequency of the signal amplified by the amplifier 1608, while the vertical axis represents the electrical power of the signal amplified by the amplifier 1608. A transmission frequency f0 represents the transmission frequency of the signal amplified by the amplifier 1608.

A frequency spectrum 1801 indicates the signal that is input to the amplifier 1608 without being subjected to distortion compensation by the distortion compensating unit 1603. A frequency spectrum 1802 indicates the signal that is output from the amplifier 1608 without being subjected to distortion compensation by the distortion compensating unit 1603. The frequency spectra 1801 and 1802 demonstrate that the nonlinearity of the input/output characteristics 1701 of the amplifier 1608 (see FIG. 17) results in the deformation of the frequency spectrum around the transmission frequency f0 of the signal, causing a side lobe to rise during amplification by the amplifier 1608.

The transmitting system 1600 depicted in FIG. 16 accurately compensates nonlinear signal distortion through the adaptive LMS algorithm by the distortion compensating unit 1603 to suppress a rise in the side lobe of the signal. The transmitting system 1600 is thus capable of amplifying/transmitting the signal while suppressing electrical power leakage to adjacent channels.

In this manner, the transmitting system 1600 according to the fifth embodiment is capable of transmitting a transmission signal whose nonlinear distortion by the amplifier 1608 is compensated accurately. For example, in mobile communication requiring large transmission electrical power, such as W-CDMA, the transmitting system 1600 accurately compensates nonlinear distortion arising on the transmission signal to prevent a leak of electrical power of the transmission signal to adjacent channels. Thus, when a wideband signal is used as the transmission signal, distortion near the transmission signal caused by a memory effect can be compensated accurately, thereby improving communication quality.

As described, according to the distortion compensating apparatus, the amplifying apparatus, the transmitting system, and the distortion compensating method, signal distortion can be compensated accurately.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensating apparatus that compensates signal distortion caused by an amplifier, comprising:
    a distortion compensating process unit that using a distortion compensation coefficient, compensates distortion of an input signal;
    a memory unit storing therein the distortion compensation coefficient; and
    a first address generating unit that generates a first address that is based on electrical power of the input signal and is for acquiring the distortion compensation coefficient from the memory unit;
    a normalizing factor determining unit that determines a normalizing factor based on the electrical power of the input signal;
    a second address generating unit that generates a second address that is based on any one among the electrical power, phase of the input signal and amplitude of the input signal, is for acquiring the distortion compensation coefficient from the memory unit, and is normalized with the normalizing factor, wherein
    the distortion compensating process unit acquires the distortion compensation coefficient from the memory unit, based on the first and the second addresses to compensate the distortion.

2. The distortion compensating apparatus according to claim 1, further comprising a calculating unit that calculates the distortion compensation coefficient, based on the input signal not yet subjected to distortion compensation and an output signal from the amplifier, wherein
    the memory unit stores therein associated with the first and the second addresses, the distortion compensation coefficient calculated by the calculating unit.

3. The distortion compensating apparatus according to claim 1, wherein the address generating unit generates the second address for which the normalizing factor is determined according to any one among the electrical power, an amplitude based on the electrical power, and a logarithmic value of the electrical power.

4. The distortion compensating apparatus according to claim 1, further comprising:
    a determining unit that based on correlation information correlating a value based on the electrical power of the input signal with the normalizing factor, determines the normalizing factor according to the electrical power of the input signal, wherein
    the address generating unit generates the second address that is normalized with the normalizing factor determined by the determining unit.

5. The distortion compensating apparatus according to claim 1, wherein
    the address generating unit generates a third address that is based on any one among the electrical power, the phase of the input signal and the amplitude of the input signal, is for acquiring the distortion compensation coefficient from the memory unit, and is normalized with the normalizing factor that is determined according to the electrical power of the input signal, and
    the distortion compensating process unit acquires the distortion compensation coefficient from the memory unit, based on the first, the second, and the third addresses to compensate the distortion.

6. The distortion compensating apparatus according to claim 5, wherein
    the address generating unit generates the third address for which the normalizing factor is determined according to any one among the electrical power, an amplitude based on the electrical power, and a logarithmic value of the electrical power.

7. The distortion compensating apparatus according to claim 1, wherein
    the address generating unit includes a calculating unit that calculates any one among the electrical power, an amplitude based on the electrical power, and a logarithmic value of the electrical power, and the address generating unit generates the first address based on a difference between a value calculated by the calculating unit and a value consequent to delaying the calculated value by a given time.

8. An amplifying apparatus comprising:
the distortion compensating apparatus according to claim 2;
the amplifier; and
a feedback line that feeds an output signal from the amplifier back to the calculating unit.

9. A transmitting system comprising:
the amplifying apparatus according to claim 8; and
a transmitting unit that transmits a signal amplified by the amplifying apparatus.

10. A distortion compensating method of compensating signal distortion caused by an amplifier, comprising:
compensating distortion of an input signal, by using a distortion compensation coefficient;
storing in a memory unit, distortion compensation coefficients;
generating a first address that is based on electrical power of the input signal and is for acquiring from among the stored distortion compensation coefficients, the distortion compensation coefficient used for compensating the distortion; and
determining a normalizing factor based on the electrical power of the input signal;
generating a second address that is based on any one among the electrical power, phase of the input signal, and amplitude of the input signal, is for acquiring from among the stored distortion compensation coefficients, the distortion compensation coefficient used for compensating the distortion, and is normalized with the normalizing factor that is determined according to the electrical power of the input signal, wherein
the distortion is compensated, by using the distortion compensation coefficient that is acquired from among the stored distortion compensation coefficients, based on the first and the second addresses.

* * * * *